(12) United States Patent
Woods et al.

(10) Patent No.: US 6,887,737 B1
(45) Date of Patent: May 3, 2005

(54) EPOXIDIZED ACETALS AND THIOACETALS, EPISULFIDIZED ACETALS AND THIOACETALS, AND REWORKABLE THERMOSETTING RESIN COMPOSITIONS FORMULATED THEREFROM

(75) Inventors: John G. Woods, Farmington, CT (US); Afranio Torres-Filho, Enfield, CT (US); Rebecca L. Tishkoff, Hamden, CT (US); Erin K. Yaeger, Glastonbury, CT (US); Jianzhao Wang, Elmsford, NY (US)

(73) Assignee: Henkel Corporation, Rocky Hill, CT (US)

( * ) Notice: Subject to any disclaimer, the term of this patent is extended or adjusted under 35 U.S.C. 154(b) by 172 days.

(21) Appl. No.: 10/013,487

(22) Filed: Dec. 13, 2001

(51) Int. Cl.[7] .................. H01L 21/58; C08L 63/00; B32B 27/38; C07D 407/00; C07D 409/00
(52) U.S. Cl. ............... 438/106; 438/4; 428/413; 428/414; 523/400; 525/530; 525/533; 549/1; 549/200; 549/356; 549/472; 549/512
(58) Field of Search .................. 525/504, 530, 525/533; 428/413, 414; 438/106, 4; 523/400; 549/1, 200, 356, 472, 512; 528/87

(56) References Cited

U.S. PATENT DOCUMENTS

| 3,879,422 | A | | 4/1975 | Batzer et al. ............. 260/340.7 |
|---|---|---|---|---|
| 5,355,580 | A | | 10/1994 | Tsukada .................... 29/840 |
| 5,512,613 | A | | 4/1996 | Afzali-Ardakani et al. . 523/443 |
| 5,560,934 | A | | 10/1996 | Afzali-Ardakani et al. . 424/497 |
| 5,760,337 | A | | 6/1998 | Iyer et al. .................. 174/52.2 |
| 5,783,867 | A | | 7/1998 | Belke, Jr. et al. ........... 257/783 |
| 5,872,158 | A | | 2/1999 | Kuczynski .................. 522/182 |
| 5,879,859 | A | * | 3/1999 | Buchwalter et al. ..... 430/280.1 |
| 5,932,682 | A | | 8/1999 | Buchwalter et al. .......... 528/94 |
| 5,948,922 | A | | 9/1999 | Ober et al. ................. 549/547 |
| 5,973,033 | A | | 10/1999 | Ober et al. ................. 523/443 |
| 6,008,266 | A | | 12/1999 | Kuczynski et al. ........... 522/31 |
| 6,258,899 | B1 | * | 7/2001 | Buchwalter et al. ........ 525/533 |
| 6,627,762 | B1 | * | 9/2003 | Woods et al. ............... 549/229 |
| 6,657,031 | B1 | * | 12/2003 | Crane et al. ................. 526/266 |
| 6,667,194 | B1 | * | 12/2003 | Crane et al. ................. 438/127 |
| 2002/0089067 | A1 | * | 7/2002 | Crane et al. ................. 257/778 |
| 2002/0171132 | A1 | * | 11/2002 | Buchwalter et al. ........ 257/678 |

FOREIGN PATENT DOCUMENTS

| RU | 767104 | 9/1980 | .......... C07D/303/30 |
|---|---|---|---|
| SU | 751811 | 7/1980 | .......... C08G/59/02 |
| WO | PCT/FR95/00898 | 1/1996 | .......... B41N/1/24 |
| WO | PCT/US97/13677 | 2/1998 | .......... G03F/7/00 |
| WO | PCT/US98/00858 | 7/1998 | .......... C08K/5/09 |

OTHER PUBLICATIONS

Abstract for Japanese Patent Application No. 69280/94, (1992).
Abstract for Japanese Patent Application No. 77264/94, (1994).
Abstract for Japanese Patent Application No. 251516/93, (1993).
Abstract for Soviet Union Patent Application No. 751811, (1980).
S. Yang e al., *Chem. Mater.*, 10(6), 1475 (1998).
J.S. Chen et al., *ACS Polymer Preprints*, 41(2), 1842 (2000).
H. Li et al., *ACS PMSE Preprints*, 83, 563 (2000).
S. Buchwalter, et al., *ACS PMSE Preprints*, 72, 450 (1995).
L. Wang and C. Wong, *Journal of Polymer Chemistry, Part A*, vol. 37, 2991 (1997).
Journal of Organic Chemistry of the USSR, Original vol. 21, No. 2, Part 1, (1985).
*Reviews on Heteroatom Chemistry*, vol. 9, "A New Strategy in the Synthesis of Epoxy Resins", (1993).

\* cited by examiner

*Primary Examiner*—Philip C. Tucker
*Assistant Examiner*—Michael J. Feely
(74) *Attorney, Agent, or Firm*—Steven C. Bauman

(57) ABSTRACT

This invention relates to epoxidized acetals and thioacetals, episulfidized acetals and thioacetals, thermosetting resin compositions based on such epoxidized acetals and thioacetals, episulfidized acetals and thioacetals, reaction products of which are controllably degradable when subjected to appropriate conditions.

27 Claims, 15 Drawing Sheets

BPA-VEGE adduct

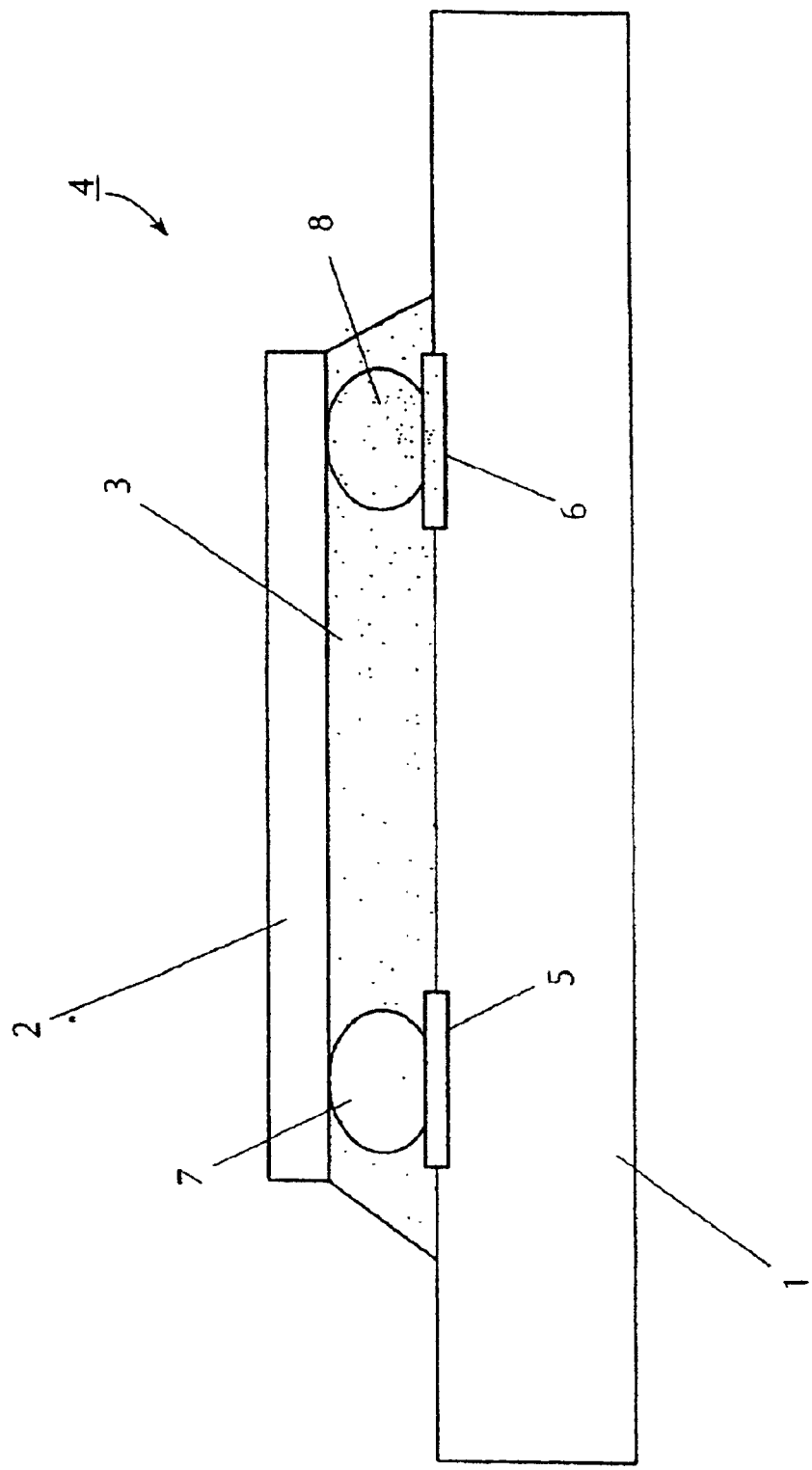

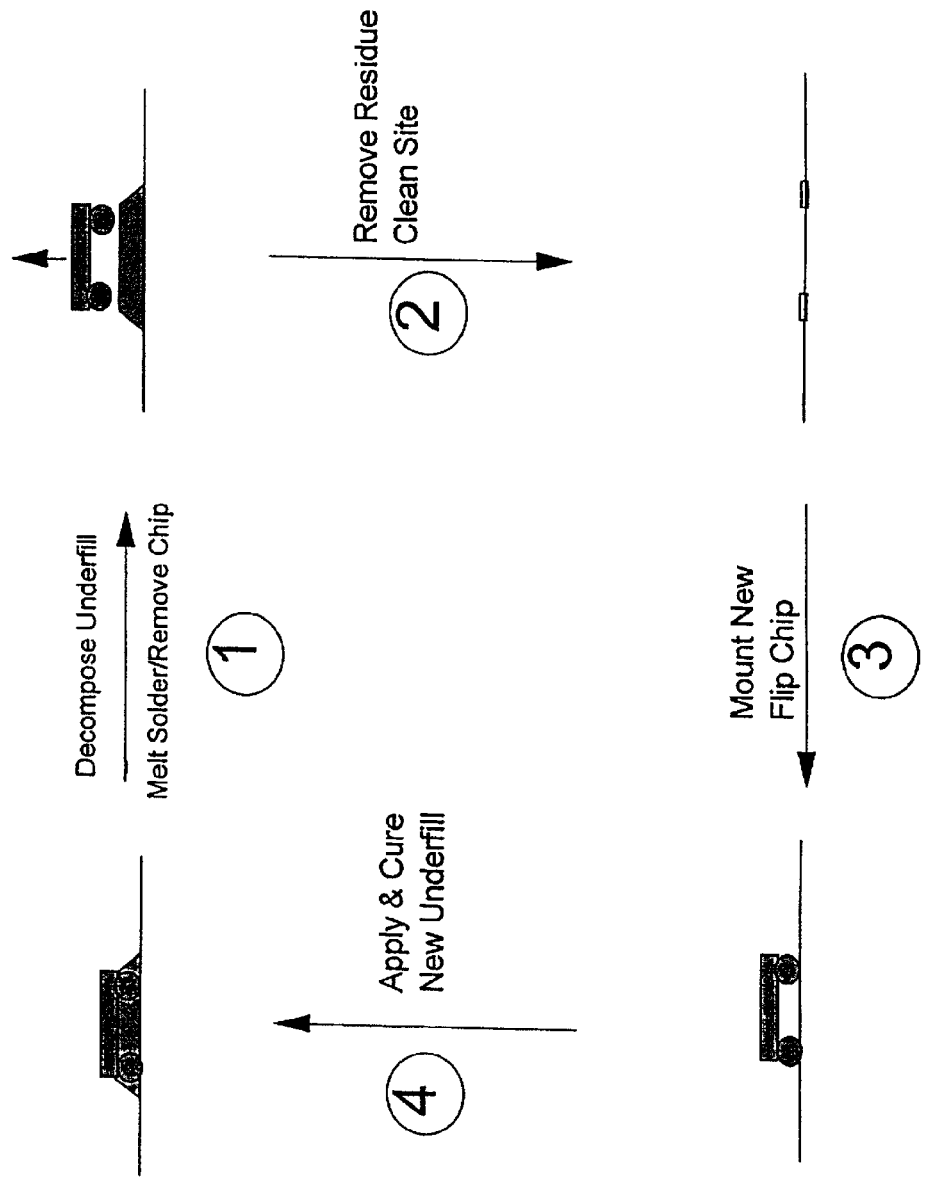

EPOXIDIZED ACETALS AND THIOACETALS, EPISULFIDIZED ACETALS AND THIOACETALS, AND REWORKABLE THERMOSETTING RESIN COMPOSITIONS FORMULATED THEREFROM

BACKGROUND OF THE INVENTION

1. Field of the Invention

This invention relates to epoxidized acetals and thioacetals, episulfidized acetals and thioacetals, thermosetting resin compositions based on such epoxidized acetals and thioacetals, episulfidized acetals and thioacetals, reaction products of which are controllably degradable when subjected to appropriate conditions.

2. Brief Description of Related Technology

In the field of microelectronic device assembly, the popularity of small-sized electronic appliances, such as camera-integrated video tape recorders ("VTRs") and portable telephone sets, has made size reduction of large scale integration ("LSI") devices desirable. As a result, chip size or chip scale packages ("CSPs"), ball grid arrays ("BGAs"), land grid arrays ("LGAs") and the like, each of which having a semiconductor chip, such as LSI, on a carrier substrate are being used to reduce the size of packages substantially to that of bare chips. Such CSPs, BGAs and LGAs improve the characteristics of the electronic device while retaining many of their operating features, thus serving to protect semiconductor bare chips, such as LSIs, and facilitate testing thereof.

Ordinarily, the CSP/BGA/LGA assembly is connected to electrical conductors on a circuit board by use of a solder connection or the like. However, when the resulting CSP/BGA/LGA circuit board structure is exposed to thermal cycling, the reliability of the solder connection between the circuit board and the CSP/BGA/LGA often becomes suspect. Recently, after a CSP/BGA/LGA assembly is mounted on a circuit board, the space between the CSP/BGA/LGA assembly and the circuit board is often now filled with a sealing resin (often referred to as underfill sealing) in order to relieve stresses caused by thermal cycling, thereby improving heat shock properties and enhancing the reliability of the structure.

However, since thermosetting resins are typically used as the underfill sealing material, in the event of a failure after the CSP/BGA/LGA assembly is mounted on the circuit board, it is very difficult to replace the CSP/BGA/LGA assembly without destroying or scrapping the structure in its entirety.

To that end, techniques for mounting a bare chip on a circuit board are accepted as substantially similar to the mounting of a CSP/BGA/LGA assembly onto a-circuit board. One such technique, disclosed in Japanese Laid-Open Patent Publication No. 102343/93, involves a mounting process where a bare chip is fixed and connected to a circuit board by use of a photocurable adhesive, where, in the event of failure, this bare chip is removed therefrom. However, this technique is limited to those instances where the circuit board includes a transparent substrate (e.g., glass) which permits exposure to light from the back side, and the resulting structure exhibits poor heat shock properties.

Japanese Laid-Open Patent Publication No. 69280/94 discloses a process where a bare chip is fixed and connected to a substrate by use of a resin capable of hardening at a predetermined temperature. In the event of failure, this bare chip is removed from the substrate by softening the resin at a temperature higher than the predetermined temperature. However, no specific resin is disclosed, and there is no disclosure about treating the resin which remains on the substrate. Thus, the disclosed process is at best incomplete.

As pointed out in Japanese Laid-Open Patent Publication No. 77264/94, it is conventional to use a solvent to remove residual resin from a circuit board. However, swelling the resin with a solvent is a time consuming process and the corrosive organic acid ordinarily used as the solvent may reduce the reliability of the circuit board. Instead, that disclosure speaks to a method for removing residual resin by irradiation with electromagnetic radiation.

Japanese Laid-Open Patent Publication No. 251516/93 also discloses a mounting process using bisphenol A type epoxy resin (CV5183 or CV5183S; manufactured by Matsushita Electric Industrial Co., Ltd.). However, the removal process so disclosed does not consistently permit easy removal of the chip, the curing step is lengthy at elevated temperatures, and the process generally results in poor productivity.

Of course, mechanical methods of removing/replacing semiconductor chips from/on a substrate are known, such as by cutting the chip to be removed/replaced. See U.S. Pat. No. 5,355,580 (Tsukada).

Thermoplastic underfill resins are known for use in semiconductor chip attachment. See U.S. Pat. No. 5,783,867 (Belke, Jr.). However, such thermoplastic resins tend to leak under relatively modest temperature conditions. In contrast, thermosetting resins cure into a matrix which ordinarily have greater thermal stability under end use operating temperatures.

U.S. Pat. No. 5,760,337 (Iyer) refers to thermally reworkable crosslinked resins to fill the gap created between a semiconductor device and a substrate to which it is attached. These resins are produced by reacting a dienophile (with a functionality greater than 1) with a 2.5-dialkyl substituted furan-containing polymer.

International Patent Publication No. PCT/US98/00858 refers to a thermosetting resin composition capable of sealing underfilling between a semiconductor device including a semiconductor chip mounted on a carrier substrate and a circuit board to which said semiconductor device is electrically connected. The composition includes about 100 parts by weight of an epoxy resin, about 3 to about 60 parts by weight of a curing agent and about 1 to about 90 parts by weight of a plasticizer. Here, the area around the cured thermoset is to be heated at a temperature of about 190 to about 260° C. for a period of time ranging from about 10 seconds to about 1 minute in order to achieve softening and a loss of much of its adhesiveness.

Recent commercial interest has led to industry efforts to produce thermoset underfill sealants, which are capable of being reworked at temperatures slightly greater than those ordinarily used, particularly where the underfill sealant compositions have been designed to cure during the solder reflow cycle. To date, apart from the present invention, it is not believed that such an underfill sealant exists or has been evaluated.

Several classes of labile-group functionalized diepoxide monomers have been examined as reactive components of reworkable underfill compositions for the bonding and reinforcement of solder-bumped flip-chip attachments to circuit boards. These compositions cure under exposure to elevated temperature conditions to form network structures that are intended to mechanically stabilize the soldered devices.

In addition, the compositions oftentimes are prepared from curable resins having a thermally labile or readily hydrolyzable functionality that permits the network to be readily degraded when the device is heated at elevated temperatures and/or when it is exposed to an acidic solution. The labile groups that have been used to impart reworkable properties to the epoxy adhesive include secondary and tertiary esters [U.S. Pat. Nos. 5,948,922 (Ober) and 5,973,033 (Ober), each of which refer to a certain class of compounds having tertiary oxycarbonyl linkages, and compositions based on such compounds, which when cured provide thermally decomposable compositions capable of being reworked; S. Yang et al., *Chem. Mater.*, 10(6), 1475 (1998), J. S. Chen et al., *ACS Polymer Preprints*, 41(2), 1842 (2000), H. Li et al., *ACS PMSE Preprints*, 83, 563 (2000)], aliphatic acetals [U.S. Pat. Nos. 5,512,613 (Afzali-Ardakani), 5,560,934 (Afzali-Ardakani) and 5,932,682 (Buchwalter), each of which refer to a reworkable thermoset composition based on a diepoxide component in which the organic linking moiety connecting the two epoxy groups of the diepoxide includes an acid cleavable acyclic acetal group, in combination with an anhydride and a diaza compound (such as an imidizole) together with a hydroxy initiator; U.S. Pat. No. 6,008,266, and S. Buchwalter et al., ACS PMSE Preprints, 72, 450 (1995)]; acetal diacrylates [U.S. Pat. No. 5,872,158 (Kuczynski) refers to thermosetting compositions capable of curing upon exposure to actinic radiation, which are based on acetal diacrylates, and reaction products of which are reported to be soluble in dilute acid]; and various carbamates [L. Wang and C. Wong, *J. Polym. Sci. Part A*, 37, 2991 (1997)].

While many of these compositions provide rapid degradation under certain conditions, commercial obstacles exist to their wide use. For instance, epoxidized secondary and tertiary esters are costly to produce and generally undergo network degradation at lower temperatures than would be desirable for widespread application. Epoxidized aliphatic acetals decompose very slowly at high temperatures, and generally require the introduction of acidic solutions to accelerate the decomposition. The acidic solution adds a considerable inconvenience and cost to the process, in addition to increasing the cost. Epoxidized carbamates ate also costly to produce; more importantly, however, they have the added undesirable effect of yielding highly toxic isocyanates following thermolysis. In addition, these compositions ordinarily leave decomposition residues on the circuit board, which the circuit board assembler needs to remove, thereby rendering the replacement of the semicondutor more difficult than is desirable.

Thus, there is a need for epoxy-based adhesive compositions that among other things (1) decompose rapidly at relatively high temperatures but not so high that the elevated temperature conditions may compromise the integrity of substrates, (2) are inexpensive to produce, (3) do not generate toxic by-products on decomposition and (4) to the extent they leave residues, such residues are easy to clean.

SUMMARY OF THE INVENTION

The present invention provides epoxidized acetals and thioacetals, episulfidized acetals and thioacetals having at least two epoxy and/or episulfide groups and at least two acetal and/or thioacetal linkages. For instance, such compounds may be represented by those within the following structures I and II:

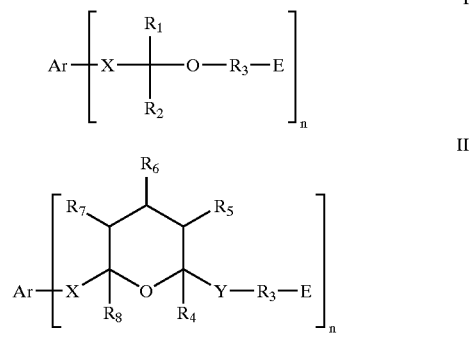

which are each described in the section entitled "Detailed Description of the Invention", which follows hereinafter. And particularly desirable compounds within structures I and II are also described.

In addition, the present invention provides methods of manufacturing such compounds, certain of such methods using commercially available and oftentimes relatively inexpensive starting materials. The present invention also provides methods of manufacturing the curable compositions formulated from such compounds as described herein.

That is, the present invention also provides a thermosetting resin composition, which includes broadly a curable resin component, at least a portion of which includes a curable aromatic compound having at least two thermally cleavable acetal or thioacetal linkages and at least two reactive groups selected from the group consisting of epoxy groups, episulfide groups, and combinations thereof; an optional inorganic filler component; and a curing agent component including an anhydride component, a nitrogen-containing component, such as an amine compound, an amide compound, and/or an imidazole compound, a polythiol compound, a polyphenol compound, a polycarboxylic acid compound, an onium salt and combinations thereof. For instance, the curable aromatic compound includes epoxidized acetals and thioacetals, and/or episulfidized acetals and thioacetals, each of which having at least two epoxy and/or episulfide groups and at least two acetal and/or thioacetal linkages.

Reaction products of these compositions are capable of softening under exposure to elevated temperature conditions, such as in excess of the temperatures used to cure the composition. Such temperature exposure combined with the epoxy acetal, which is susceptible to thermal degradation at such temperature exposure, provides the reworkable aspect of this invention. The remaining components, discussed below, provide the physical properties and characteristics for the compositions and reaction products to render the compositions attractive for commercial use, particularly in the microelectronics industry. To that end, the inventive thermosetting resin composition is useful as an underfill sealing material, and enables a semiconductor device, such as a CSP/BGA/LGA assembly which includes a semiconductor chip mounted on a carrier substrate, to be securely connected to a circuit board by short-time heat curing and with good productivity.

Reaction products of these compositions permit the semiconductor device to be easily removed from the circuit board by localized heating in the event of semiconductor device or connection failure. This makes it possible to reuse the circuit board (with the remaining functioning semiconductor devices still electrically attached) and thereby achieve an improvement in the yield of the production process and a reduction in production cost. Reaction products of these compositions leave decomposition residues that are easy to clean, rendering re-use of the semiconductor device and/or circuit board particularly attractive.

The compositions of this invention may also be used for microelectronic applications beyond sealing underfill, such as with glob top, direct chip attachment and other applications for thermosetting compositions.

In addition, the compositions may be used in far-flung applications, where thermosetting epoxies, or for that matter other thermosetting or thermoplastic adhesive, coating and sealant compositions, may be used. For instance, the compositions may be used in the assembly of products, whose component parts have value as do the intermediate/finished products, to facilitate assembly and disassembly thereof where defective component parts are found. In that event, the defective component part(s) may be readily removed from the intermediate/finished product(s) and be replaced without having to scrap the entire intermediate/finished product(s). In addition, the speed with which the disassembly may proceed allows throughput to remain high. Non-microelectronic examples of such assembly includes prosthetic devices and aerospace assembly and subassembly.

The reaction products of the curable compositions defined herein are controllably degradable at temperatures higher than heretofore reported reworkable thermosets, while remaining at temperatures sufficiently low so as not to compromise the integrity of the substrates and components with which the compositions are destined to be used.

Other benefits and advantages of the present invention will become more readily apparent after a reading of the "Detailed Description" section together with the figures.

BRIEF DESCRIPTION OF THE DRAWINGS

FIG. 14 depicts a cross-sectional view showing an example of the mounting structure in which the thermosetting resin composition of the present invention is used.

FIG. 15 depicts a flow diagram of a procedure useful to rework a cured thermosetting resin composition in accordance with the present invention, so as to remove a semiconductor device from a circuit board to which it had been attached.

DETAILED DESCRIPTION OF THE INVENTION

Figure 1:
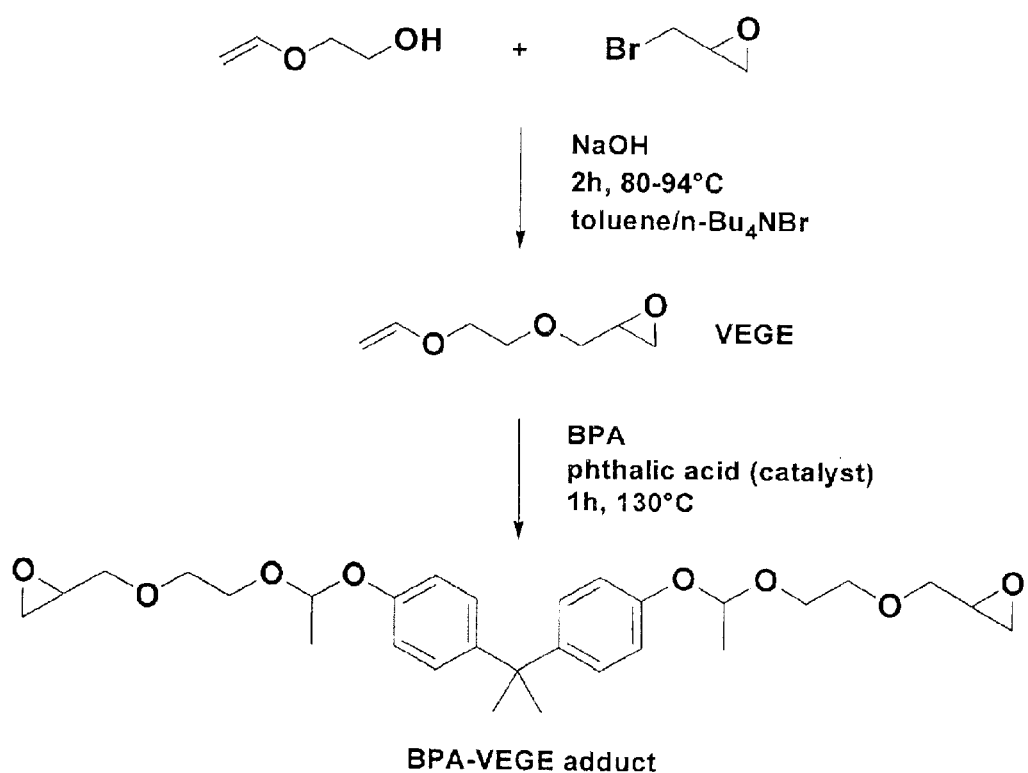
FIG. 1 depicts a synthesis to arrive at bisphenol-A/2-vinyloxyethylglycidyl ether adduct ("BPA-VEGE"), as outlined in Example 1.

As noted above, the epoxidized acetals, episulfidized acetals, epoxidized thioacetal and episulifized thioacetals are those within the following structures I and II and as described in more detail below may be prepared by reacting multi-functional phenols or thiophenols with for instance epoxide- or episulfide-functionalized 1-alkenylethers, or epoxide- or episulfide-functionalized 3,4-dihydropyrans:

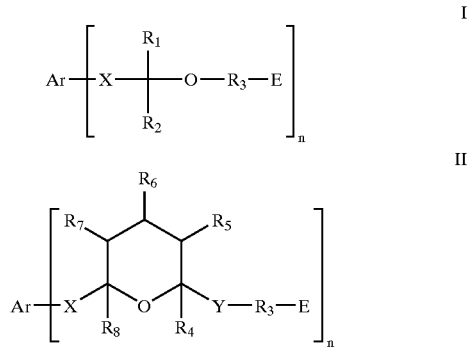

wherein:

X is an oxygen atom or a sulfur atom;

Ar represents a single aromatic ring nucleus or multiple aromatic ring nuclei, which may be fused or linked through direct covalent bonds, oxygen atoms, sulfur atoms, ketone groups, sulfoxide groups, sulfone groups, $C_{1-6}$ alkylene or $C_{2-6}$ alkenylene groups optionally substituted with trifluoromethyl groups, or poly ($C_{2-4}$ oxyalkylene) and the aromatic ring(s) may be further optionally substituted with $C_{1-6}$ alkyl, $C_{3-8}$ cyloalkyl, $C_{2-6}$ alkenyl, alkoxy groups, acetyl groups, or methylol groups;

n represents an integer between 2 and 6 when Ar is a single aromatic ring nucleus and an integer between 2 and 8 when Ar is a multiple aromatic ring nuclei;

Y is an oxygen atom, an alkylene group, such as a methylene group, or a carbonyl group;

$R_1$ is hydrogen or alkyl, such as $C_{1-3}$ alkyl;

$R_2$ is $C_{1-8}$ alkyl, $C_{2-8}$ alkenyl or $C_{6-11}$ aryl group;

$R_3$ is $C_{1-15}$ alkylene, $C_{3-15}$ cycloalkylene, $C_{7-15}$ bicycloalkylene, $C_{2-15}$ alkenylene, $C_{5-15}$ cycloalkenylene, $C_{7-30}$ bicycloalkenylene, $C_{1-15}$ alkylene ester, $C_{2-15}$ alkenylene ester, $C_{2-30}$ alkenylene ester, $C_{2-15}$ alkenylene ether, phenylene, phenylene ether, or phenylene ester, each of which may be optionally substituted with one or more hydroxyl, alkoxy, or ester or interrupted with one or more ester, ether, or carbamate groups;

$R_4$, $R_5$, $R_6$, $R_7$, $R_8$ are independently H, $C_{1-12}$ alkyl, alkenyl, cyclo- or bicyclo-alkyl, cyclo- or bicycloalkenyl, or aryl; and E represents an aliphatic, cycloaliphatic or bicycloaliphatic epoxide or episulfide group having the structure indicated by E1–E4:

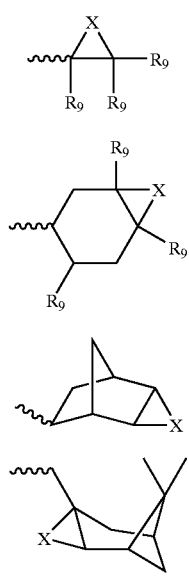

where $R_9$ is a H atom or a $C_{1-6}$ alkyl group, X is as defined above and the wavy line indicates the attachment to $R_3$ of structure I or II.

Particularly desirable examples of the epoxidized acetals, episulfidized acetals, epoxidized thioacetals and episulifized thioacetals include bisphenol A ("BPA") or F ("BPF")/2-vinyloxyethylglycidyl ether ("VEGE") adduct ("BPA-VEGE" or "BPF-VEGE", respectively), BPA or BPF/2-vinyloxybutyl glycidyl ether ("VBGE") adducts ("BPA-VBGE" or "BPF-VBGE", respectively), 4,4'-bisphenol/VEGE adduct, 4,4',4"-trihydroxytriphenylmethane/VEGE adduct ("THPM-VEGE"), 4,4',4"-trihydroxytriphenylmethane/1-glycidoxymethyl-4-vinyloxymethylcyclohexane adduct ("THPM-VBGE"), 1,4-hydroquinone/2-vinyloxyethylglycidyl ether adduct ("HQ-VEGE"), 1,4-hydroquinone/2-vinyloxybutyl glycidyl ether adduct ("HQ-VBGE"), BPA or BPF/1-glycidoxymethyl-4-vinyloxymethylcyclohexane adduct ("BPA-GOVOC" or "BPF-GOVOC", respectively), 1,4-hydroquinone/1-glycidoxymethyl-4-vinyloxymethylcyclohexane adduct ("HQ-GOVOC") and 1,4-hydroquinone/2-vinyloxybutyl glycidyl ether adducts 4,4',4"-trihydroxytriphenylmethane 1-glycidoxymethyl-4-vinyloxymethylcyclohexane adduct ("THPM-GOVOC").

Curable resin compositions which are useful as underfill sealants between a semiconductor device and a circuit board to which the semiconductor device is electrically connected or a semiconductor chip and a circuit board to which the semiconductor chip is electrically connected, includes broadly (a) an epoxy resin component, at least a portion of which is a curable aromatic compound having at least two acetal or thioacetal linkages and at least two epoxy groups, episulfide groups, and combinations thereof; and (b) a curing agent component selected from an anhydride component, a nitrogen-containing component, such as an amine compound, an amide compound, and/or an imidazole compound, polythiols, polyphenols, polycarboxylic acids, onium salts and combinations thereof. Reaction products of these compositions are capable of softening under exposure to elevated temperature conditions, such as in excess of the temperature chosen to cure the composition. Loss of adhesion to the substrate occurs at temperatures greater than that which was used to cure the composition. For instance, at least about 50% of adhesion to the substrate is typically lost at temperatures in excess of about 200° C.

Typically, the composition includes about 10 to about 70 weight percent of the epoxy resin component by weight of the total composition, of which about 10 to about 75 weight percent thereof is comprised of an epoxy compound having at least one thermally cleavable anhydride linkage; and 3 to about 100 weight percent of the curing agent component, based on the total weight of the curable resin component, depending of course on the type and identity of the curing agent chosen. In addition, 0 to about 70 weight percent of an inorganic filler component and/or 0 to about 5 weight percent of a flowability agent may also be included. Also, co-curing agents, initiators and catalysts, such as ethylene glycol and dibenzyl amine, may also be included. When included, the amount chosen is typically a small percentage of the overall weight of the composition, rather than being linked to any particular stoichiometric ratio.

Of course, depending on the particular set of properties desirable for a composition destined for a specific purpose these values may vary somewhat. Such variation may be achieved without undue experimentation by those persons skilled in the art, and accordingly are contemplated within the scope of the present invention.

The curable resin component of the present invention may include any common epoxy resin, such as a multifunctional epoxy resin. Ordinarily, the multifunctional epoxy resin should be included in an amount within the range of about 30 to about 70 weight percent, such as about 40 to about 60 weight percent, based on the weight of the total of the epoxy resin component. In the case of bisphenol-F-type epoxy resin, desirably the amount thereof should be in the range of from about 35 to about 65 weight percent, such as about 40 to about 50 weight percent of the total of the epoxy resin component.

Examples of the multifunctional epoxy resin include bisphenol-A-type epoxy resin, bisphenol-F-type epoxy resin (such as RE-404-S from Nippon Kayaku, Japan), phenol novolac-type epoxy resin, and cresol novolac-type epoxy from resin (such as "ARALDITE" ECN 1871 from Ciba Specialty Chemicals, Hawthorne, N.Y.).

Other suitable epoxy resins include polyepoxy compounds based on aromatic amines and epichlorohydrin, such as N,N,N',N'-tetraglycidyl-4,4'-diaminodiphenyl methane; N-diglycidyl-4-aminophenyl glycidyl ether; and N,N,N',N'-tetraglycidyl-1,3-propylene bis-4-aminobenzoate.

Among the epoxy resins suitable for use herein also include polyglycidyl derivatives of phenolic compounds, such as those available commercially under the tradename "EPON", such as "EPON" 828, "EPON" 1001, "EPON" 1009, and "EPON" 1031 from Shell Chemical Co.; "DER" 331, "DER" 332, "DER" 334, and "DER" 542 from Dow Chemical Co.; and "BREN-S" from Nippon Kayaku. Other suitable epoxy resins include polyepoxides prepared from polyols and the like and polyglycidyl derivatives of phenol-formaldehyde novolacs, the latter of which are available commercially under the tradename "DEN", such as "DEN" 431, "DEN" 438, and "DEN" 439 from Dow Chemical. Cresol analogs are also available commercially under the tradename "ARALDITE", such as "ARALDITE" ECN 1235, "ARALDITE" ECN 1273, and "ARALDITE" ECN 1299 from Ciba Specialty Chemicals. SU-8 is a bisphenol-A-type epoxy novolac available from Interez, Inc. Polyglycidyl adducts of amines, aminoalcohols and polycarboxylic acids are also useful in this invention, commercially available resins of which include "GLYAMINE" 135, "GLYAMINE" 125, and "GLYAMINE" 115 from F.I.C. Corporation; "ARALDITE" MY-720, "ARALDITE" 0500, and "ARALDITE" 0510 from Ciba Specialty Chemicals and PGA-X and PGA-C from the Sherwin-Williams Co.

Still other epoxy resins that are suitable for use herein include aliphatic epoxies with alkylene oxide residues, examples of which include, but are not limited to, mono-, di- or multi-functional epoxies containing ether linkages, such as primary, secondary and tertary alkylene diol diglycidyl ethers, and epoxies containing mono- or poly-alkylene oxide

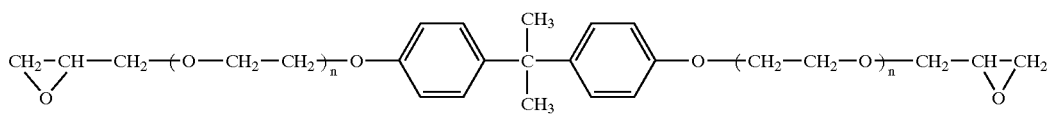

residues (such as ethylene oxide, propylene oxide, butylene oxide, pentylene oxide, and hexylene oxide residues).

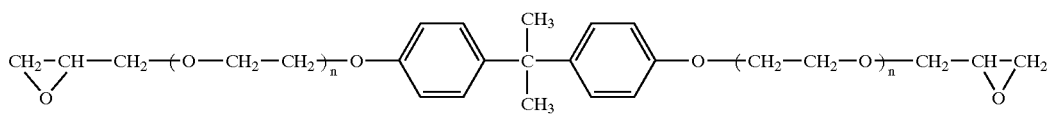

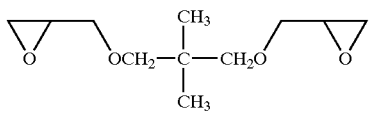

For instance,

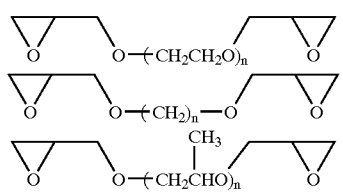

where n is an integer from 1 to about 18, are each appropriate, individually or in combination, for use as at least a portion of the epoxy resin component.

Examples of cycloaliphatic epoxies with alkylene oxide residues include mono, di- or multi functional cyclohexyl epoxies; hydrated bisphenol A-type epoxies; and hydrated bisphenol F-type epoxies, containing alkylene ether residues. DME-100 (1,4-cyclohexane dimethanol diglycidyl ether, available commercially from New Japan Chemical Co., Ltd.) as shown below is one such example.

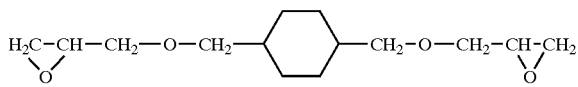

Examples of aromatic epoxies with alkylene oxide residues include mono-, di- or multi-functional epoxies such as bisphenol A type epoxies; bisphenol F type epoxies; phenol novolac type epoxies; and cresol novolac type epoxies, containing alkylene ether residues.

Examples of such epoxies include BEO-60E (ethoxylated bisphenol A di-glycidyl ether, available commercially from New Japan Chemical Co., Ltd.), and BPO-20E (propyloxylated bisphenol A di-glycidyl ether, available commercially from New Japan Chemical Co., Ltd.), which are shown below:

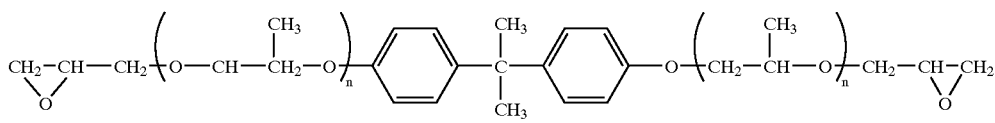

here n is an integer between and about 1 and 20, which for BPO-60E n is 1, and

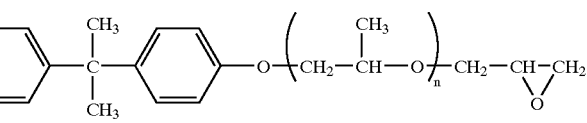

where n is an integer between and about 1 and 20, which for BEO-60E n is 3.

In addition, curable compounds having at least one polymerizable group selected from oxiranes, thiiranes, and combinations thereof, substituted on at least three of the substitutable positions on the oxirane and/or thiirane carbons, respectively, with an alkyl, alkenyl or aryl substituent having a carbon content of 1 to about twelve carbon atoms, with or without substitution or interruption by one or more heteroatoms or halogens, as appropriate, may also be included in the in inventive compositions. For instance, limonene diepoxide, gamma-terpinene diepoxide, nopol diepoxide and combinations thereof, are particularly desirable curable compounds that may further be included in the inventive compositions.

And of course combinations of the different epoxy resins are also desirable for use herein.

The epoxy or episulfide compounds with at least two acetal linkages may be chosen from those within the following structures, I and II:

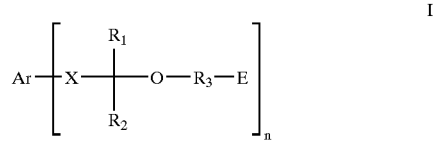

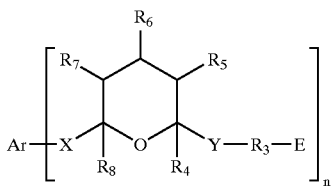

wherein:

X is an oxygen atom or a sulfur atom;

Ar represents a single aromatic ring nucleus or multiple aromatic ring nuclei, which may be fused or linked through direct covalent bonds, oxygen atoms, sulfur atoms, ketone groups, sulfoxide groups, sulfone groups, $C_{1-6}$ alkylene or $C_{2-6}$ alkenylene groups optionally substituted with trifluoromethyl groups, or poly ($C_{2-4}$ oxyalkylene) and the aromatic ring(s) may be further optionally substituted with $C_{1-6}$ alkyl, $C_{3-8}$ cyloalkyl, $C_{2-6}$ alkenyl, alkoxy groups, acetyl groups, or methylol groups;

n represents an integer between 2 and 6 when Ar is a single aromatic ring nucleus and an integer between 2 and 8 when Ar is a multiple aromatic ring nuclei;

Y is an oxygen atom, an alkylene group, such as a methylene group, or a carbonyl group;

$R_1$ is hydrogen or alkyl, such as $C_{1-3}$ alkyl;

$R_2$ is $C_{1-8}$ alkyl, $C_{2-8}$ alkenyl or $C_{6-11}$ aryl group;

$R_3$ is $C_{1-15}$ alkylene, $C_{3-15}$ cycloalkylene, $C_{7-15}$ bicycloalkylene, $C_{2-15}$ alkenylene, $C_{5-15}$ cycloalkenylene, $C_{7-30}$ bicycloalkenylene, $C_{1-15}$ alkylene ester, $C_{2-15}$ alkylene ether, $C_{2-30}$ alkenylene ester, $C_{2-15}$ alkenylene ether, phenylene, phenylene ether, or phenylene ester, each of which may be optionally substituted with one or more hydroxyl, alkoxy, or ester or interrupted with one or more ester, ether, or carbamate groups;

$R_4$, $R_5$, $R_6$, $R_7$, $R_8$ are independently H, $C_{1-12}$ alkyl, alkenyl, cyclo- or bicyclo-alkyl, cyclo- or bicycloalkenyl, or aryl; and E an aliphatic, cycloaliphatic or bicycloaliphatic epoxide or episulfide group having the structure indicated by E1–E4:

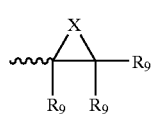
E1

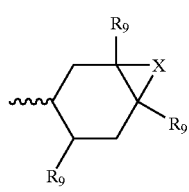
E2

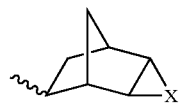
E3

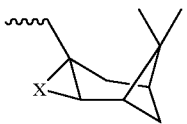
E4 where $R_9$ is a H atom or a $C_{1-6}$ alkyl group, X is as defined above and the wavy line indicates the attachment to $R_3$ of structure I or II.

The presence in the curable resin component of the epoxy or episulfide compound(s) with at least two acetal or thioacetal linkages allows for controlled degradation under elevated temperature conditions, thereby permitting repair, replacement, recovery and/or recycling of operative electronic components from assemblies that have become at least in part inoperative.

The curing agent component should include materials capable of catalyzing the polymerization of the epoxy resin component of the inventive compositions. Desirable curing agents for use with the present invention include an anhydride component, a nitrogen-containing component, such as an amine compound, an amide compound, and an imidazole compound, a polythiol compound, a polyphenol compound, a polycarboxylic acid compound, an onium salt and combinations thereof.

Appropriate anhydride compounds for use herein include mono- and poly-anhydrides, such as hexahydrophthalic anhydride ("HHPA") and methyl hexahydrophthalic anhydride ("MHHPA") (commercially available from Lindau Chemicals, Inc., Columbia, S.C., used individually or as a combination, which combination is available under the trade designation "LINDRIDE" 62C), 5-(2,5-dioxotetrahydrol)-3-methyl-3-cyclohexene-1,2-dicarboxylic anhydride (commercially available from ChrisKev Co., Leewood, Kans. under the trade designation B-4400) and nadic methyl anhydride.

Of course, combinations of these anhydride compounds are also desirable for use in the compositions of the present invention.

The nitrogen-containing compounds include aza compounds (such as di-aza compounds or tri-aza compounds), examples of which include:

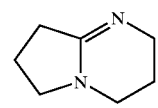

1,5-Diazabicyclo[4.3.0]non-5-ene

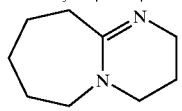

1,8-Diazabicyclo[5.4.0]undec-5-ene (DBU

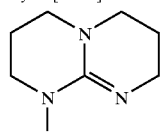

1,5,7-Triazabicyclo[4.4.0]dec-5-ene and the bicyclo mono- and di-aza compounds:

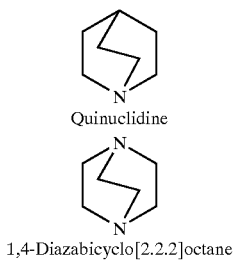

Quinuclidine 1,4-Diazabicyclo[2.2.2]octane

Examples of the amine compounds include aliphatic polyamines, such as diethylenetriamine, triethylenetetramine and diethylaminopropylamine; aromatic polyamines, such as m-xylenediamine and diaminodiphenylamine; and alicyclic polyamines, such as isophoronediamine and menthenediamine.

Of course, combinations of these amine compounds are also desirable for use in the compositions of the present invention.

Examples of amide compounds include cyano-functionalized amides, such as dicyandiamide.

The imidazole compounds may be chosen from imidazole, isoimidazole, and substituted imidazoles—such as alkyl-substituted imidazoles (e.g., 2-methyl imidazole, 2-ethyl-4-methylimidazole, 2,4-dimethylimidazole, butylimidazole, 2-heptadecenyl-4-methylimidazole, 2-undecenylimidazole, 1-vinyl-2-methylimidazole, 2-n-heptadecylimidazole, 2-undecylimidazole, 1-benzyl-2-methylimidazole, 1-propyl-2-methylimidazole, 1-cyanoethyl-2-methylimidazole, 1-cyanoethyl-2-undecylimidazole, 1-cyanoethyl-2-phenylimidazole, 1-guanaminoethyl-2-methylimidazole and addition products of an imidazole and trimellitic acid, 2-n-heptadecyl-4-methylimidazole and the like, generally where each alkyl substituent contains up to about 17 carbon atoms and desirably up to about 6 carbon atoms), and aryl-substituted imidazoles [e.g., phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4, 2-naphthyl-4,5-diphenylimidazole, 1-benzyl-2-methylimidazole, 2-p-methoxystyrylimidazole, 2-phenyl-4,5-dihydroxymethyl imidazole and the like, generally where each aryl substituent contains up to about 10 carbon atoms and desirably up to about 8 carbon atoms].

Examples of commercial imidazole compounds are available from Air Products, Allentown, Pa. under the trade designation "CUREZOL" 1B2MZ and from Synthron, Inc., Morganton, N.C. under the trade designation "ACTIRON" NXJ-60.

Examples of the modified imidazole compounds include imidazole adducts formed by the addition of an imidazole compound to an epoxy compound. For instance, "AJI-CURE" PN-23, commercially available from Ajinomoto Co., Inc., Tokyo, Japan, is believed to be an adduct of EPON 828 (bisphenol-A-type epoxy resin, epoxy equivalent 184-194, commercially available from Shell Chemical Co.), 2-ethyl-4-methylimidazole and phthalic anhydride. Others commercially available ones from Ajinomoto include "AMICURE" MY-24, "AMICURE" GG-216 and "AMIC-URE" ATU CARBAMATE. In addition, "NOVACURE" HX-3722 (an imidazole/bisphenol A epoxy adduct dispersed in bisphenol A epoxy) and "NOVACURE" HX-3921 HP, commercially available from Asahi-Ciba, Ltd., may also be used.

Of course, combinations of these imidazole compounds are also desirable for use in the compositions of the present invention.

Examples of the polythiols include pentaerythritol tetrakis (3-mercaptopropionate); pentaerythritol tetrakis(2-mercaptoacetateate); trimethylolpropane tris(3-mercaptopropionate); trimethylolpropane tris(2-mercaptoacetateate); 1,6-hexanedithiol; thiol-terminated polysulfides such as those sold under THIOPLAST tradename by Akcros Chemicals; and the trimercaptan sold under the CAPCURE 3-800 tradename by Henkel Corporation, to name a few.

Examples of the polyphenols include phenol formaldehyde resins (such as novolac resins and resole resins); 4,4-isopropylidenediphenol (bisphenol A); bis(4-hydroxyphenyl)methane (bisphenol F); poly(4-hydroxyphenol); 4,4'-biphenol; 2,2'-biphenol; pyrogallol, phloroglucinol; 2,3,4'-trihydroxybenzophenone; 1,1,1-tris (4-hydroxyphenyl)ethane; tetrakis(4-hydroxyphenyl) ethane; 2,6-dihydroxynaphthalene; 2,2'-diallylbisphenol A; 1,5-diallyl-2,6-dihydroxynaphthalene; and phenol-terminated poly(2,6-dimethyl-1,4-phenylene ether).

Examples of polycarboxylic acids include ethyl malonic acid; succinic acid; 2,3-dimethylsuccinic; glutaric acid, adipic acid; tetramethylhexanedioic acid; suberic acid; pimelic acid; azelaic acid; 1,10-decanedicarboxylic acid; sebacic acid; maleic acid; fumaric acid; citraconic acid; citric acid diglycolic acid; 3-phenylglutaric acid; benzylmalonic acid; 1,4-phenylenediacetic acid; phthalic acid; isophthalic acid; terephthalic acid; 1,3,5-benzenetricarboxylic acid; 2,3-naphthylenedicarboxylic acid; pamoic acid; carboxylic acid functionalized polyesters; carboxylic acid functionalized polyacrylates and carboxylic acid functionalized acrylonitrile-butadiene copolymers.

Examples of onium salts include amine-boron trihalide complexes such as boron trifluoride mono-ethylamine complex or boron trichloride-triethylamine complex; quaternary phosphonium salts such as allyl triphenylphosphonium bromide; triaryl sulfonium salts; and diaryliodonium salts.

The curing agent component may be used in an amount of from about 3 to about 100 weight percent, based on the weight of the curable aromatic resin component, depending of course on the type and identity of the curing agent component.

Cyanate esters may also be used in the inventive compositions. The cyanate esters useful as a component in the inventive compositions may be chosen from dicyanatobenzenes, tricyanatobenzenes, dicyanatonaphthalenes, tricyanatonaphthalenes, dicyanato-biphenyl, bis(cyanatophenyl)methanes and alkyl derivatives thereof, bis(dihalocyanatophenyl)propanes, bis (cyanatophenyl)ethers, bis(cyanatophenyl)sulfides, bis (cyanatophenyl)propanes, tris(cyanatophenyl)phosphites, tris(cyanatophenyl)phosphates, bie(halocyanatophenyl) methanes, cyanated novolac, bis[cyanatophenyl (methylethylidene)]benzene, cyanated bisphenol-terminated thermoplastic oligomers, and combinations thereof.

More specifically, aryl compounds having at least one cyanate ester group on each molecule and may be generally represented by the formula $Ar(OCN)_m$, where Ar is an aromatic radical and m is an integer from 2 to 5. The aromatic radical Ar should contain at least 6 carbon atoms, and may be derived, for example, from aromatic hydrocarbons, such as benzene, biphenyl, naphthalene, anthracene, pyrene or the like. The aromatic radical Ar may also be derived from a polynuclear aromatic hydrocarbon in which at least two aromatic rings are attached to each other through a bridging group. Also included are aromatic radicals derived from novolac-type phenolic resins—i.e., cyanate esters of these phenolic resins. Ar may also contain further ring-attached, non-reactive substituents.

Examples of such cyanate esters include, for instance, 1,3-dicyanatobenzene; 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanato-biphenyl; bis(4-cyanatophenyl)methane and 3,3', 5,5'-tetramethyl bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl) phosphate; bis(3-chloro-4-cyanatophenyl)methane; cyanated novolac; 1,3-bis[4-cyanatophenyl-1-(methylethylidene)]benzene and cyanated bisphenol-terminated polycarbonate or other thermoplastic oligomer.

Other cyanate esters include cyanates disclosed in U.S. Pat. Nos. 4,477,629 and 4,528,366, the disclosure of each of which is hereby expressly incorporated herein by reference; the cyanate esters disclosed in U.K. Pat. No. 1,305,702, and the cyanate esters disclosed in International Patent Publication WO 85/02184, the disclosure of each of which is hereby expressly incorporated herein by reference. Of course, combinations of these cyanate esters within the imidazole component of the compositions of the present invention are also desirably employed herein.

Particularly desirable cyanate esters for use herein are available commercially from Ciba Specialty Chemicals, Tarrytown, N.Y. under the tradename "AROCY" [1,1-di(4-cyanatophenylethane)]. The structures of three "AROCY" cyanate esters are shown below:

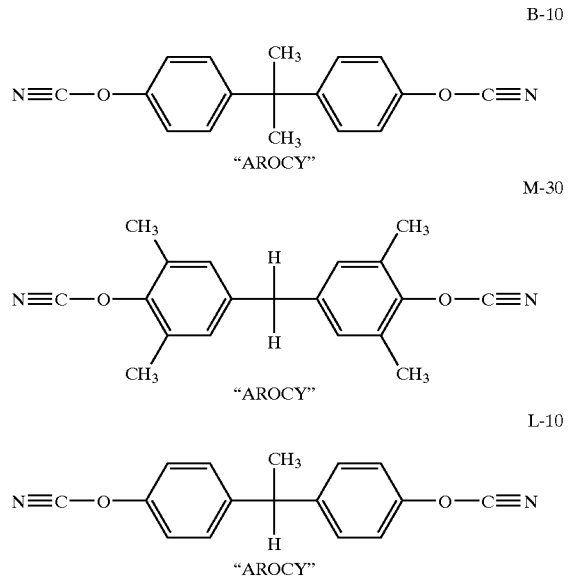

A particularly desirable cyanate ester for use herein is available commercially from Ciba Specialty Chemicals, Tarrytown, N.Y. under the tradename "AROCY" L10 [1,1-di(4-cyanatophenylethane)].

When used, the cyanate esters may be used in an amount of about 0.5 to about 20 weight percent, such as about 5 to about 15 weight percent, desirably about 7 to about 10 weight percent, based on the total amount of the curable resin component.

In addition, the composition may also include an inorganic filler component and/or a flowability agent, such as a silane and/or a titanate.

As an inorganic filler component, many materials are potentially useful. For instance, the inorganic filler component may often include reinforcing silicas, such as fused silicas, and may be untreated or treated so as to alter the chemical nature of their surface. Virtually any reinforcing fused silica may be used.

Particularly desirable ones have a low ion concentration and are relatively small in particle size (e.g., in the range of about 2–10 microns, such as on the order of about 2 microns), such as the silica commercially available from Admatechs, Japan under the trade designation SO-E5.

Other desirable materials for use as the inorganic filler component include those constructed of or containing aluminum oxide, silicon nitride, aluminum nitride, silica-coated aluminum nitride, boron nitride and combinations thereof.

When used, the inorganic filler component should be present in an amount of about 20 to about 70 weight percent, such as about 30 to about 60 weight percent, desirably about 40 to about 50 weight percent.

Appropriate silanes for use herein include octyl trimethoxy silane (commercially available from OSI Specialties Co., Danbury, Conn. under the trade designation A-137), and methacryloxy propyl trimethoxy silane (commercially available from OSI under the trade designation A-174).

Appropriate titanates for use herein include titanium IV tetrakis [2,2-bis[(2-propenyloxy)methyl]-1-butanolato-0] [bis(ditridecylphosphito-0), dihydrogen]$_2$ (commercially available from Kenrich Petrochemical Inc., Bayonne, N.J. under the trade designation KR-55).

When used, the flowability agent may be used in an amount of 0 to about 5 weight percent, such as about 0.5 to about 2 weight percent based on the total weight of the composition.

In addition, adhesion promoters, such as the silanes, glycidyl trimethoxysilane (commercially available from OSI under the trade designation A-187) or gamma-amino propyl triethoxysilane (commercially available from OSI under the trade designation A-1100), may be used.

Conventional additives may also be used in the compositions of the present invention to achieve certain desired physical properties of the composition, the cured reaction product, or both.

For instance, it may be desirable in certain instances (particularly where a large volume of inorganic filler component is used) to include a reactive co-monomer component for the epoxy resin component, such as a reactive diluent.

Appropriate reactive diluents for use herein may include monofunctional or certain multifunctional epoxy resins. The reactive diluent should have a viscosity which is lower than that of the epoxy resin component. Ordinarily, the reactive diluent should have a viscosity less than about 250 cps. In the event such a monofunctional epoxy resin is included as a reactive diluent, such resin should be employed in an amount of up to about 50 weight percent, based on weight of the curable resin component.

The monofunctional epoxy resin should have an epoxy group with an alkyl group of about 6 to about 28 carbon atoms, examples of which include $C_{6-28}$ alkyl glycidyl ethers, $C_{6-28}$ fatty acid glycidyl esters and $C_{6-28}$ alkylphenol glycidyl ethers.

Commercially available monofunctional epoxy resin reactive diluents include those from Pacific Epoxy Polymers, Richmond, Mich., under the trade designations PEP-6770 (glycidyl ester of neodecandoic acid), PEP-6740 (phenyl glycidyl ether) and PEP-6741 (butyl glycidyl ether).

Commercially available multifunctional epoxy resin reactive diluents include those from Pacific Epoxy Polymers, under the trade designations PEP-6752 (trimethylolpropane triglycidyl ether) and PEP-6760 (diglycidyl aniline).

The compositions of the present invention may further contain other additives, such as defoaming agents, leveling agents, dyes, and pigments. Moreover, photopolymerization initiators may also be incorporated therein, provided that such initiators do not adversely affect the properties of the composition or reaction products formed therefrom.

The thermosetting resin compositions of the present invention may be of the one-pack type, in which all the ingredients are mixed together, or of the two-pack type in which the curable component(s), is(are) included in one part and the curing agent is stored separately in a second part, and mixed together only prior to use.

During a microelectronic underfill application, the thermosetting resin compositions according to the present invention penetrate and flow readily into the space between the semiconductor chip and the circuit board, or at least show a reduction in viscosity under heated or use conditions thus penetrating and flowing easily.

Reference to FIG. 14 shows a flip chip assembly (i.e., a FC package) in which a thermosetting resin composition of the present invention has been applied and cured.

The FC package 4 is formed by connecting a semiconductor chip (a bare chip) 2 to a carrier substrate 1 (e.g., a circuit board) and sealing the space therebetween suitably with a thermosetting resin composition 3.

More specifically, for example, in the assembly of FC semiconductor devices using stud bump bonding technology, the semiconductor chip 2 may be passed over a substrate bearing a conductive adhesive paste (such as a metal-filled epoxy) to form a layer thereof on the semiconductor chip 2. The layer is ordinarily formed by a printing mechanism. The conductive adhesive paste may be applied on either the carrier substrate or the semiconductor chip. One way to do this is with the stencil claimed and described in International Patent Publication No. PCT/FR95/00898. Alternatively, this connection may also be made by an anisotropically conductive adhesive. See International Patent Publication No. PCT/US97/13677.

Thereafter, the semiconductor chip 2 is positioned over the carrier substrate 1 in such a manner so that the semiconductor chip 2 is in alignment with the electrodes 5 and 6 on the carrier substrate 1, now coated with a patterned layer of conductive adhesive paste or solder, 7 and 8. The conductive adhesive paste may be cured by a variety of ways, though ordinarily a heat cure mechanism is employed.

In order to improve reliability, the space between the semiconductor chip 2 and the carrier substrate 1 is sealed with a thermosetting resin composition 3. The cured product of the thermosetting resin composition should completely fill that space.

The semiconductor chip ordinarily may be coated with a polyimide-, poly-benzocyclobutane- or silicon nitride-based material to passivate environmental corrosion.

Carrier substrates may be constructed from ceramic substrates of $Al_2O_3$, $SiN_3$ and mullite ($Al_2O_3$—$SiO_2$); substrates or tapes of heat-resistant resins, such as polyimides; glass-reinforced epoxy; ABS and phenolic substrates which are also used commonly as circuit boards; and the like. Any electrical connection of the semiconductor chip to the carrier substrate may be used, such as connection by a high-melting solder or electrically (or anisotropically) conductive adhesive and the like. In order to facilitate connections, particularly in SBB technology, the electrodes may be formed as wire bond bumps.

Using a suitable application technique, the inventive composition may be applied to the periphery of the electrically-connected semiconductor chip. The composition penetrates by capillary action into the space between the carrier substrate and the semiconductor chip.

The inventive composition may be then cured by exposure to elevated temperature conditions. During the early stage of such heat exposure, the composition shows a significant reduction in viscosity and hence an increase in fluidity, so that it more easily penetrates into the space between the carrier substrate and the semiconductor chip. Moreover, by preheating the carrier substrate, the composition may penetrate more easily into the entire space between the carrier substrate and the semiconductor chip.

Curable compositions of the present invention may ordinarily be cured by heating to a temperature in the range of about 120 to about 180° C. for a period of time of about 0.5 to 30 minutes. However, generally after application of the composition, an initial cure time of about 1 minute sets up the composition, and complete cure is observed after about 5 to about 15 minutes at a temperature of about 165° C. Thus, the composition of the present invention can be used at relatively moderate temperatures and short-time curing conditions, and hence achieve very good productivity.

The composition should be applied in a suitable amount so as to fill almost completely the space between the carrier substrate and the semiconductor chip, which amount of course may vary depending on application.

Cured reaction products of the compositions of the present invention demonstrate excellent adhesive force, heat resistance and electric properties, and acceptable mechanical properties, such as flex-cracking resistance, chemical resistance, moisture resistance and the like, for the applications for which they are used herein.

In the mounting process which uses the inventive compositions, after the semiconductor device is mounted on the circuit board as described above, the resulting structure is tested with respect to characteristics of the semiconductor device, connection between the semiconductor device and the circuit board, other electrical characteristics, and the state of sealing. In the event a failure is found, repair can be made in the following manner and as shown in the flow diagram depicted in FIG. 15.

The area around the semiconductor device which has failed is heated at a temperature of about 190 to about 260° C. for a period of time ranging from about 10 seconds to about 5 minutes. (See FIG. 15, step 1.) Desirably, the temperature should be maintained in the range of about 210 to about 220° C. and the period of time should be within the 30 seconds to 2 minute range. Although no particular limitation is placed on the way in which heating occurs, localized heating is particularly desirable, such as the application of hot air to the failure site by a heating gun.

As soon as the solder is melted and the resin is softened by partial decomposition to cause a reduction in bond strength, the semiconductor device may be pulled apart and removed from the substrate, such as with tweezers or pliers.

After the semiconductor device 4 is removed, a residue of the cured reaction product of the thermosetting resin composition and a residue of the solder are left on the circuit board 5. The residue of the cured product of the thermosetting resin composition can be removed, for example, by scraping it off after the residue has been softened by heating it to a predetermined temperature.

The residue of the solder can be removed, for example, by use of a solder-.absorbing braided wire. (See FIG. 15, step 2.)

Finally, a new semiconductor chip may be mounted again onto the circuit board (which has been cleaned as described above) and re-fluxed. (See FIG. 15, step 3.) Following mounting, a thermosetting resin composition in accordance with this invention may be dispensed in the area between the semiconductor device and the circuit board. (See FIG. 15, step 4.) Repair of the failure site is thus completed.

Where a failure site is found in the circuit board, the semiconductor device can be reused by removing the residue of the cured reaction product of the thermosetting resin composition and the residue of the solder left on the bottom of the semiconductor device in the same manner as described above.

The present invention will be more readily appreciated with reference to the examples which follow.

EXAMPLES

These examples describe the syntheses of epoxy acetal monomers, compositions based on such epoxy acetals, performance of the compositions and network degradation studies of reaction products of these compositions.

Syntheses of Epoxy-Functional Aromatic Diacetals

Epoxy-functional aromatic acetals may be prepared by the addition of phenols to vinyloxy glycidyl ethers using perfluorinated acids and their acetals as catalysts. Similarly, multi-functional phenols may be reacted with epoxidized vinyl ether monomers in the presence of weak carboxylic acid catalysts to yield the corresponding multi-functional epoxidized aromatic acetals. The syntheses of several diepoxidized aromatic diacetals by this method are described below. Reaction products of adhesives formulated with epoxy-functional aromatic acetals within the scope of this invention are easily reworked by heating at elevated temperatures for short periods of time.

Example 1
Part A: Synthesis of 2-vinyloxyethylglycidyl Ether ("VEGE"):

To a 1000 ml three-necked round bottom flask, equipped with a thermocouple, magnetic stirrer and heating mantle, was added ethylene glycol vinyl ether (35.2 g; 0.400 moles), epibromohydrin (62.4 g; 0.456 mole), toluene (200 ml), and tetrabutylammonium bromide (1.5 g). Sodium hydroxide pellets (32 g 0.8 moles) were then added portionwise, with the reaction temperature maintained at 80° C. The reaction mixture was vigorously stirred for a period of time of about 1 hour at a temperature of 80° C. The mixture was then filtered and rinsed with a small amount of toluene. The toluene was removed using a rotary evaporator under reduced pressure and the crude product distilled under vacuum to yield 2-vinyloxyethylglycidyl ether ("VEGE") (34.6 g; 60% yield), b.p. 55–57° C. at 0.75 torr. The structure of VEGE was confirmed by $^1$H NMR analysis (300 MHz; CDCl$_3$): δ 6.5 (q, 1H, CH$_2$=CH—), δ 4.0 and 4.2 (two d, 2H, CH$_2$=CH—), δ 3.85 (m, 4H, O—CH$_2$—CH$_2$—O), δ 3.8 and 3.45 (m, 2H, O—CH$_2$—CH—), δ 3.2 (m, 1H, epoxide ring —CH(CH$_2$)—O), δ 2.6 and 2.8 (m, 2H, epoxide ring —CH(CH$_2$)—O).

Part B: Synthesis of Bisphenol A-VEGE Adduct ("BPA-VEGE"):

To a 100 ml round bottom flask, equipped with a thermocouple, magnetic stirrer and heating mantle, was added bisphenol A ("BPA") (22.8 g; 0.1 moles), VEGE (28.8 g 0.2 moles) and ortho-phthalic acid ("OPA", 0.9 g; 5.4 mmoles; ~5 mole % of BPA). The reaction mixture was heated at 125–130° C. for a period of time of 1 hour and cooled to yield a pale yellow colored, moderately viscous oil (50.0 g; 97% yield), the structure of which was confirmed to be BPA-VEGE by $^1$H NMR analysis (300 MHz; CDCl$_3$): δ 6.9–7.2 (d, aromatic 5H), δ 5.45 (q, 1H, —O—CH(CH$_3$)—O), δ 3.6–4.0 (m, 4H, O—CH$_2$—CH$_2$—O), δ 3.45 (m, 2H, O—CH$_2$—CH—), δ 3.2 (m, 1H, OCH$_2$—CH(CH$_2$)—O), δ 2.6 and 2.8 (m, 2H, epoxide ring —CH(CH$_2$)—O), δ 1.5–1.7 (d, 3H, CH$_3$—C—CH$_3$).

The overall synthesis of BPA-VEGE is depicted in FIG. 1.

Figure 5:
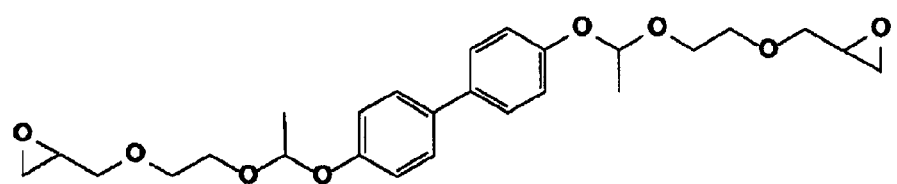
FIG. 5 depicts the chemical structure of 4,4'-biphenol-VEGE adduct.

Example 2
Synthesis of 4,4'-biphenol-VEGE Adduct:

4,4'-Biphenol-VEGE adduct was synthesized according to the procedure outlined in Example 1, Part B. In this reaction, bisphenol A was replaced with 4,4'-biphenol and a slight excess (about 7%) of VEGE was employed. When the reaction was complete, the excess VEGE was removed under reduced pressure to give the biphenyl epoxy acetal in quantitative yield. The structure of the product (see FIG. 5) was confirmed by $^1$H NMR analysis (300 MHz; CDCl$_3$): δ 7.5, 7.1, 6.9 (m, aromatic H), δ 5.6 (q, 1H, —O—CH(CH$_3$)—O), δ 3.7~3.9 (m, 4H, O—CH$_2$—CH$_2$—O), δ 3.7~3.45 (m, 2H, O—CH$_2$—CH—), δ 3.2 (m, 1H, OCH$_2$—CH(CH$_2$)—O), δ 2.6 and 2.8 (m, 2H, epoxide ring —CH(CH$_2$)—O), δ 1.5~1.7 (d, 3H, CH$_3$—C—CH$_3$).

Figure 3:
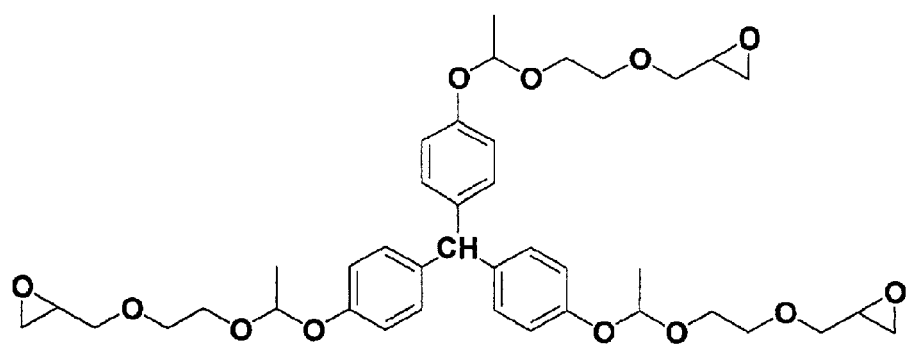
FIG. 3 depicts the chemical structure of 4,4',4"-trihydroxytriphenylmethane/VEGE adduct ("THPM-VEGE").

Example 3
Synthesis of 4,4',4"-trihydroxytriphenylmethane-VEGE Adduct ("THPM-VEGE"):

To a 25 ml flask equipped with a magnetic stirrer, thermocouple and heating mantle, was added 4,4'4"-trihydroxytriphenylmethane (2.92 g; 0.01 moles), VEGE (4.31 g 0.03 moles) and OPA (0.14 g). The mixture was heated at a temperature in the range of about 125–130° C. for a period of time of 1 hour and then cooled, thereby providing THPM-VEGE. The structure of THPM-VEGE was confirmed by $^1$H NMR analysis, and is shown in FIG. 3.

Example 4
Synthesis of 1,4-hydroquinone-VEGE ("HQ-VECE") Adduct

Figure 7:
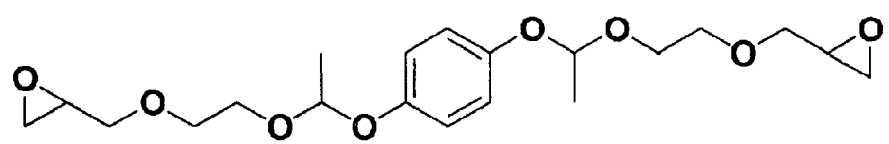
FIG. 7 depicts the chemical structure of 1,4-hydroquinone-VEGE adduct ("HQ-VEGE").

To a 100 ml round bottom 3-necked flask, equipped with a thermocouple, magnetic stirrer, condenser, nitrogen inlet and heating mantle, was added 1,4-hydroquinone ("HQ") (11.00 g; 0.10 moles), VEGE (30.42 g; 0.21 moles) and OPA (0.9 g; 5.4 m moles). The reaction mixture was heated at a temperature of 113–127° C. for a period of time of about 6 hours. The reaction flask was evacuated for a period of time of about 1.3 hours at 1 torr to remove residual VEGE and cooled to give a pale yellow colored, low viscosity oil (39.44 g; 99% yield). $^1$H NMR confirmed the oil to be the diacetal adduct, HQ-VEGE, the chemical structure for which is shown in FIG. 7. The purity of the material was estimated by GC to be about 95%. $^1$H NMR analysis (300 MHz; CDCl$_3$): δ 6.95 (s, aromatic 4H), δ 5.35 (q, 2H, —O—CH(CH$_3$)—O), δ 3.7–3.9 (m, 8H, O—CH$_2$—CH$_2$—O), δ 3.5–3.9 (m, 4H, O—CH$_2$—CH—), δ 3.2 (m, 2H, epoxide ring —CH(CH$_2$)—O), δ 2.6 and 2.8 (m, 4H, epoxide ring —CH(CH$_2$)—O), δ 1.5 (d, 6H, —O(CH$_3$)C—O).

Example 5
Part A: Synthesis of 1-glycidoxymethyl-4-vinyloxymethylcyclohexane ("GOVOC")

To a two liter 3-neck round bottom flask equipped with thermocouple, universal stirrer, and 250 ml additional funnel was added 50% sodium hydroxide solution (400 g; 5 mole NaOH). The flask was cooled in an ice bath to below 5° C. and tetrabutylammonium bromide (16.1 g; 0.05 mole) added while the temperature was maintained below 5° C. Epichlorohydrin (185 g; 2 mole) was added dropwise into the reaction flask over a period of time of 20 minutes during which time the temperature was kept below 5° C. Cyclohexanedimethanol monovinylether (120 g; 0.71 moles) was added dropwise over a period of time of 40 minutes during which time the temperature was kept below 20° C. During the addition of the vinyl ether, deionized water (about 160 g) was added periodically to the reaction mixture to prevent agglomeration of the salt by-products. A milky reaction mixture was formed and the stirring was continued for a further 24 hours while the temperature was kept below 25° C. Water (70 ml) was added and the organic layer separated, dried over sodium sulfate and filtered to yield a crude mixture of 1-glycidoxymethyl-4-vinyloxymethylcyclohexane ("GOVOC"), and unreacted epichlorohydrin. Gas chromatographic ("GC") analysis confirmed that all of the starting vinyl ether was consumed. The crude product mixture was fractionated under vacuum to yield 1-glycidoxymethyl-4-vinyloxymethylcyclohexane ("GOVOC"), b.p. 125–127° C. at 0.8 torr (62.67 g; 39%), as a colorless liquid. GC analysis indicated a purity of about 99%. The structure of the product was confirmed by spectral analysis. $^1$H NMR analysis (300 MHz; $CDCl_3$): δ 6.45 (m, 1H, O—C$\underline{H}$=CH$_2$); δ 3.9–4.2 (m, 2H, O—CH=C$\underline{H}_2$); 3.3–3.9 (m, 6H, —C$\underline{H}_2$O—); δ 3.2 (m, 1H, epoxide ring —C$\underline{H}$(CH$_2$)—O), δ 2.6 and 2.8 (m, 2H, epoxide ring —CH(C$\underline{H}_2$)—O); 1.0–1.9 (m, 10H, —C$_6\underline{H}_{10}$—).

Figure 9:
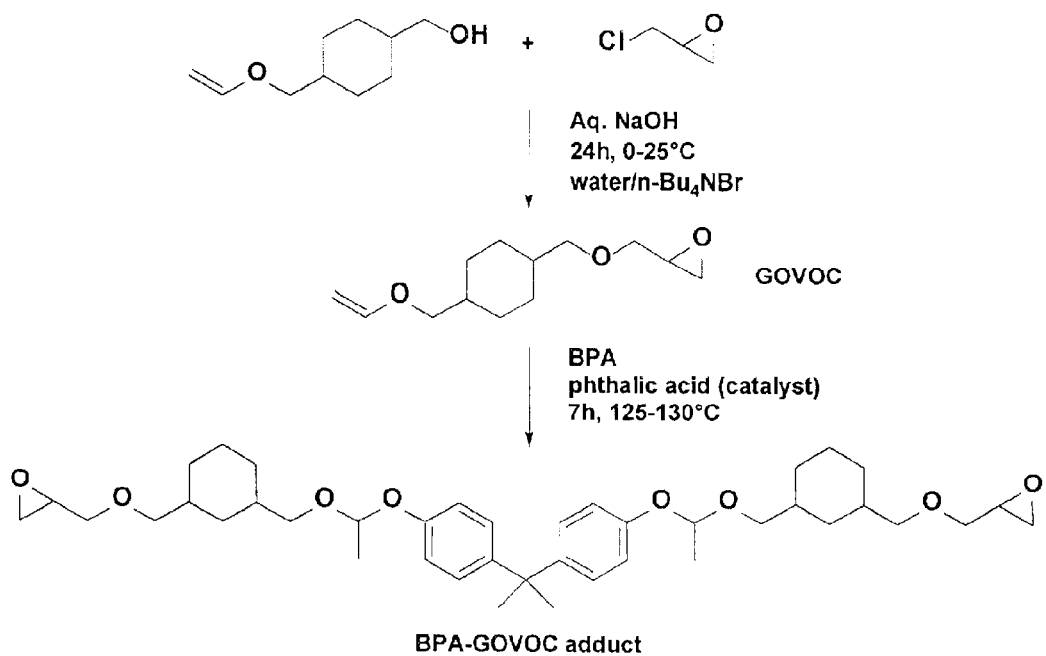
FIG. 9 depicts a synthesis to arrive at bisphenol-A/1-glycidoxymethyl-4-vinyloxymethylcyclohexane adduct ("BPA-GOVAC"), as outlined in Example 5.

Part B: Synthesis of bisphenol A-GOVOC Adduct ("BPA-GOVOC"):

To a 100 mL 3-necked reaction flask equipped with thermocouple, magnetic stirrer, condenser and nitrogen inlet was added bisphenol A (5.70 g; 0.025 moles), GOVOC (11.30 g; 0.05 moles) and OPA (0.21 g; 1.3 mmoles). The mixture was heated at a temperature of 125–130° C. for a period of time of 7 hours under a nitrogen atmosphere to yield bisphenol A-GOVOC adduct ("BPA-GOVOC") as a light yellow colored, viscous resin (16.34 g; 96%). The structure of the resin was confirmed by $^1$H NMR analysis (300 MHz; $CDCl_3$): δ 6.9–7.2 (d, aromatic 8H), δ 5.35 (q, 1H, —O—C$\underline{H}$(CH$_3$)—O), δ 3.3–3.8 (m, 12H, O—C$\underline{H}_2$—), δ 3.2 (m, 2H, epoxide ring —C$\underline{H}$(CH$_2$)—O), δ 2.6 and 2.8 (m, 4H, epoxide ring —CH(C$\underline{H}_2$)—O), δ 0.9–1.9 (m, 26H, —C$_6\underline{H}_{10}$— and C$\underline{H}_3$—C—C$\underline{H}_3$). See FIG. 9.

Example 6
Synthesis of 1,4-hydroquinone-GOVOC Adduct ("HQ-GOVOC")

The adduct of 1,4-hydroquinone and GOVOC was prepared by the method described in Example 4 using 0.21 moles of GOVOC rather than VEGE.

Formulations of Epoxy-Functional Aromatic Diolefines, and Thermal Decomposition Analysis of Cured Reaction Products The cure schedule, or the time required for the onset of cure to occur at a certain temperature, in a specified period of time, may be measured by differential scanning calorimetry ("DSC").

Upon curing, the epoxy-based compositions of the present invention together with the curing agent form reaction products, which are networks characterized by having a glass transition temperature ("Tg") that depends, in part, on the density of crosslinks in the particular material. ΔTg is the change in glass transition temperature observed after heating under the specified conditions. DSC also assists in determining the rate and extent of Tg loss as a measure of network breakdown.

In the cured state, a variety of properties are useful depending on the end use for which the composition is destined. For instance, adhesion provides information on the strength of the bond formed by the cured reaction product. In an adhesion evaluation, die shear adhesion is measured by a Sebastian 5 die shear measurement instrument, which measures the amount of shear strength (in psi) required to pull apart a die attached to a circuit board with about two milligrams of the cured reaction product as an underfill sealant (without a solder mask, or chipbonding adhesive).

Reworkability determines the ease with which a cured reaction product may be controllably degraded. The extent to which the cured reaction product loses mass over time at an increase in temperature may be measured by thermal gravimetric analysis ("TGA"), and provides information on the temperature (or range) at which the cured reaction product degrades.

Practical reworkability may be demonstrated using a hot air generator to heat the area around the die, fixed to the circuit board with the inventive compositions, to an air temperature of about 280° C., with a die temperature of about 215–220° C. for a period of time of about 2 minutes. Then, the die may be easily removed by pulling or twisting the die from the circuit board using tweezers in a period of time of about 30 seconds. The circuit board may then be cleaned using a dremel at about 25,000–30,000 rpm, followed by application of a flat-end horse hair brush. The circuit board cleaning ordinarily occurs within a period of time of about 2 minutes.

The site of the failed semiconductor chip may then be fluxed and a new semiconductor chip may be attached using conventional flip chip technology. Then, the inventive composition may be applied around the periphery of the newly-replaced semi-conductor chip and cured by heating to an appropriate temperature, as described herein.

Example 7
Thermal Decomposition Analysis of BPA-VEGE Adduct Cured with Anhydride A heat curable epoxy composition was prepared by blending together BPA-VEGE, and a curative combination of an anhydride, hexahydro-4-methylphthalic anhydride ("HHMPA"), N,N-dimethylbenzylamine ("DBA") and ethylene glycol ("EG"), according to the formulation in Table 1.

TABLE 1

BPA-VEGE formulation (Sample No. 1)
Anhydride/epoxy equivalent weight ratio = 0.80

| Component | Molecular Weight | Weight % | Mole Fraction |
|---|---|---|---|
| BPA-VEGE | 516 | 65.3 | 0.37 |
| HHMPA | 168 | 33.4 | 0.59 |

TABLE 1-continued

BPA-VEGE formulation (Sample No. 1)
Anhydride/epoxy equivalent weight ratio = 0.80

| Component | Molecular Weight | Weight % | Mole Fraction |
| --- | --- | --- | --- |
| EG | 62 | 0.7 | 0.03 |
| DBA | 135 | 0.6 | 0.01 |

Sample No. 1, 8–10 mg, was dispensed into a DSC pan, hermetically sealed and cured by heating at a temperature of 103° C. for a period of time of 72 hours followed by a post-cure at a temperature of 140° C. for a period of time of 3 hours.

DSC analysis was then performed on the cured sample over the temperature range −20 to +200° C. in order to determine the initial Tg (heating rate 20° C./minute). The sample was then heated under isothermal conditions at temperatures typically employed for reworking (about 200–300° C.) and the change in Tg (ΔTg) determined as a function of the heating time.

Figure 2:
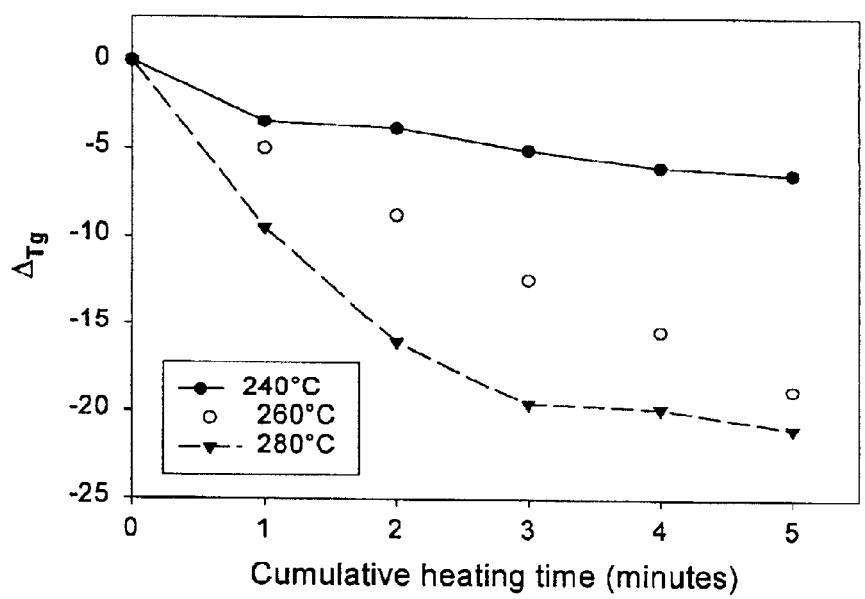
FIG. 2 depicts the thermal degradation of an anhydride-cured BPA-VEGE formulation as a function of heating time at various temperatures. ΔTg is the change in glass transition temperature observed after heating under the specified conditions. Initial Tg=35° C.

The decomposition of Sample No. 1 was examined at temperatures of 240, 260 and 280° C., the results of which are shown in FIG. 2. At 220° C., little change in the initial Tg was observed over the first five minutes of heating. This indicates that the product has good thermal stability at this temperature. In contrast, at 260° C. there is a moderately rapid and progressive reduction in Tg over the same period of time. The network is clearly undergoing a significant decomposition and it can be expected, therefore, that this product can be effectively reworked at temperatures in the range 240 to 260° C. At 280° C., there is a very rapid decomposition over the first 2 minutes of heating indicating that the system decomposes in a consistent and controlled manner that is determined by the reworking temperature.

Example 8
Thermal Decomposition Analysis of HQ-VEGE Adduct Cured with Anhydride

A heat curable epoxy composition was prepared by blending together a diepoxy, diacetal, HQ-VEGE, and a curative combination of HHMPA, DBA and EG, according to the formulation in Table 2.

TABLE 2

HQ-VEGE formulation (Sample No. 2)
Anhydride/epoxy equivalent weight ratio = 0.86

| Component | Molecular Weight | Weight % | Mole Fraction |
| --- | --- | --- | --- |
| HQ-VEGE | 398 | 57.3 | 0.35 |
| HHMPA | 168 | 41.1 | 0.60 |
| EG | 62 | 1.0 | 0.04 |
| DBA | 135 | 0.6 | 0.01 |

Sample No. 2, 8–10 mg, was dispensed into a DSC pan hermetically sealed and cured by heating at 100° C. for a period of time of 2 hours followed by a post-cure at a temperature of about 140° C. for a period of time of 6 hours. The Tg was determined by DSC and the thermal decomposition was evaluated as a function of heating time under isothermal conditions as described in Example 7. The results are shown in FIG. 8.

Figure 8:
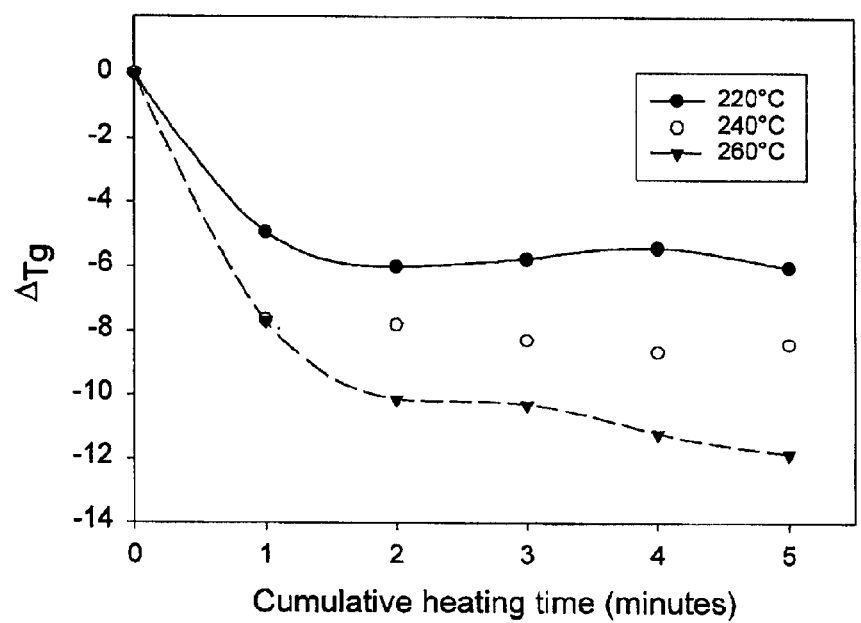
FIG. 8 depicts the thermal degradation of anhydride cured HQ-VEGE formulation as a function of heating time at various temperatures. Initial Tg=46° C.

The data in FIG. 8 shows that there is a rapid degradation of the cured network at temperatures in excess of 220° C. Both the rate and extent of degradation increase with increasing temperature. Thus these materials are suitable for use as reworkable underfill adhesives.

Example 9
Thermal Decomposition Analysis of BPA-GOVOC Adduct Cured with Anhydride A heat curable epoxy composition was prepared by blending together the diepoxy diacetal, BPA-GOVOC, and a curative combination of HHMPA, DBA and EG, according to the formulation in Table 3.

TABLE 3

BPA-GOVOC formulation (Sample No. 3)
Anhydride/epoxy equivalent weight ratio = 0.84

| Component | Molecular Weight | Weight % | Mole Fraction |
| --- | --- | --- | --- |
| BPA-GOVOC | 680 | 69.2 | 0.35 |
| HHMPA | 168 | 29.4 | 0.59 |
| EG | 62 | 0.9 | 0.05 |
| DBA | 135 | 0.5 | 0.01 |

Figure 10:
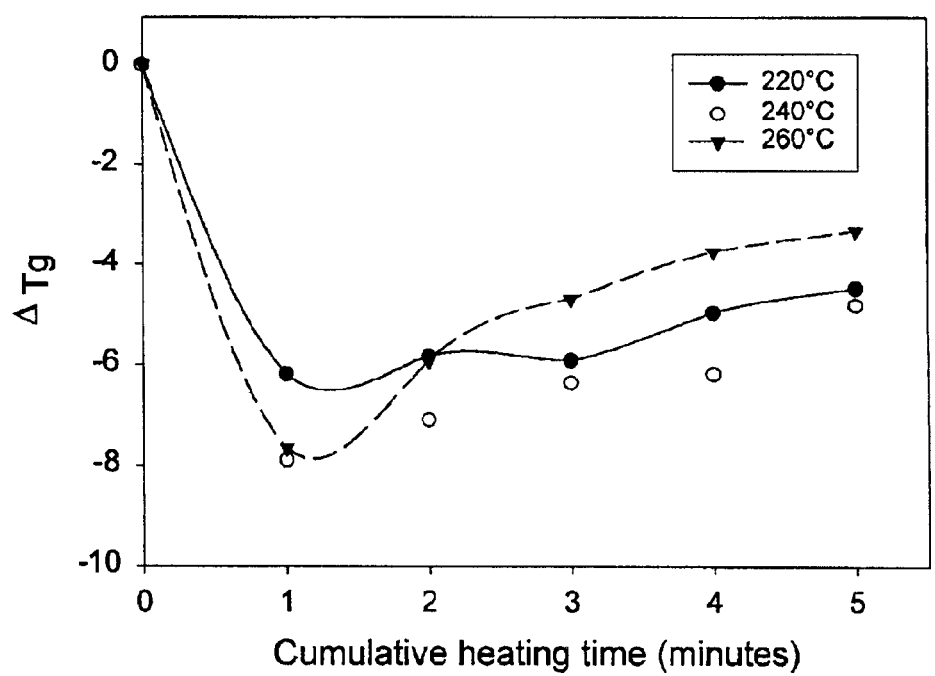
FIG. 10 depicts the thermal degradation of an anhydride-cured BPA-GOVOC adduct as a function of heating time at various temperatures. Initial Tg=61° C.

Sample No. 3 was cured to form a reaction product and analyzed by DSC as described in Example 8, with the results shown in FIG. 10.

The data in FIG. 10 shows a rapid degradation of the cured network structure during the first minute of exposure to temperatures in the region of 220° C.–240° C., indicating reworkability at this temperature range and within this time frame.

Example 10
Thermal Decomposition Analysis of BPA-DGE and BPA-VEGE Adducts Cured with Anhydride For comparative purposes, a heat curable epoxy adhesive composition was prepared by blending together the commercially available epoxy monomer, bisphenol A diglycidyl ether ("BPA-DGE"), and the curative combination of HHMPA, DBA, and EG, according to the formulation in Table 4a.

TABLE 4a

BPA-DGE formulation (Sample No. 4a)
Anhydride/epoxy equivalent weight ratio = 0.82

| Component | Molecular weight | Weight % | Mole Fraction |
| --- | --- | --- | --- |
| BPA-DGE | 340 | 53.4 | 0.35 |
| HHMPA | 168 | 43.7 | 0.57 |
| EG | 62 | 1.6 | 0.06 |
| DBA | 135 | 1.3 | 0.02 |

A similar formulation containing BPA-VEGE was also prepared according to the formulation in Table 4b.

TABLE 4b

BPA-VEGE formulation (Sample No. 4b)
Anhydride/epoxy equivalent weight ratio = 0.88

| Component | Molecular weight | Weight % | Mole Fraction |
| --- | --- | --- | --- |
| BPA-VEGE | 516 | 61.7 | 0.33 |
| HHMPA | 168 | 35.5 | 0.58 |
| EG | 62 | 1.7 | 0.07 |
| DBA | 135 | 1.1 | 0.02 |

Figure 12:
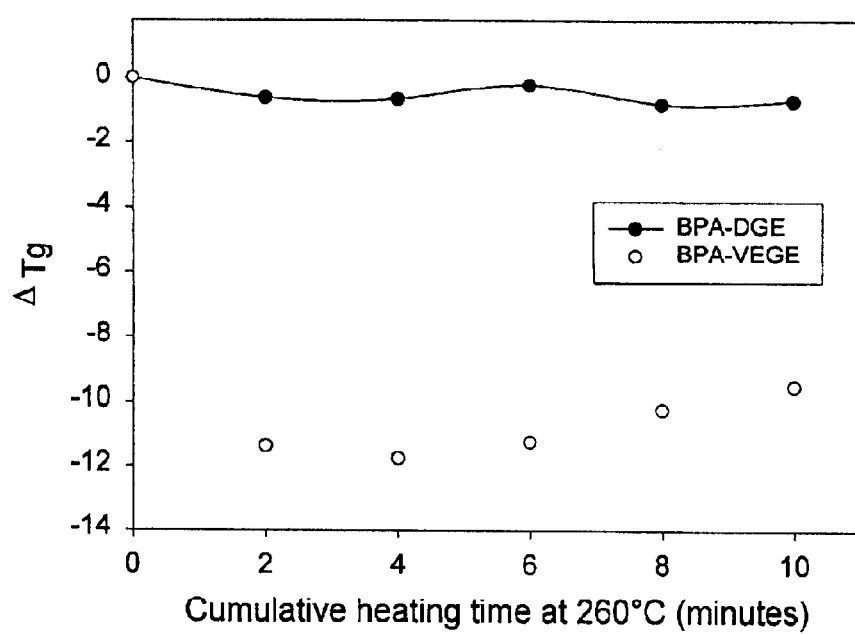
FIG. 12 depicts the thermal degradation of anhydride-cured BPA/diglycidyl ether adduct ("BPA-DGE") and BPA-VEGE formulations as a function of heating time at 260° C. Initial Tg of BPA-DGE formulation=127° C.; Initial Tg of BPA-VEGE formulation=51° C.

Sample Nos. 4a and 4b were cured to form their respective reaction products and analyzed by DSC as described in Example 8, with the results shown in FIG. 12. Sample No. 4a, the BPA-DGE based formulation, showed no significant reduction in Tg and no network degradation on heating at 260° C. over 10 minutes. The BPA-DGE based formulation is, consequently, unsuitable for reworking.

In contrast, Sample No. 4b, the BPA-VEGE-based formulation, exhibited rapid decomposition over the first two minutes of heating at 260° C. and is particularly suitable for rework applications.

Example 11

Thermal Decomposition Analysis of ERL-4221 Adduct Cured with Anhydride

For comparative purposes, a composition based on 3,4-epoxycyclohexylmethyl-3,4-epoxycyclohexane-carboxylate (ERL-4221) was prepared as shown in Table 5.

TABLE 5

ERL-4221 formulation (Sample No. 5)
Anhydride/epoxy equivalent weight ratio = 0.75

| Component | Molecular Weight | Weight % | Mole Fraction |
|---|---|---|---|
| ERL-4221 | 252 | 49.2 | 0.38 |
| HHMPA | 168 | 48.9 | 0.57 |
| EG | 62 | 0.8 | 0.03 |
| DBA | 135 | 1.1 | 0.02 |

Figure 11:
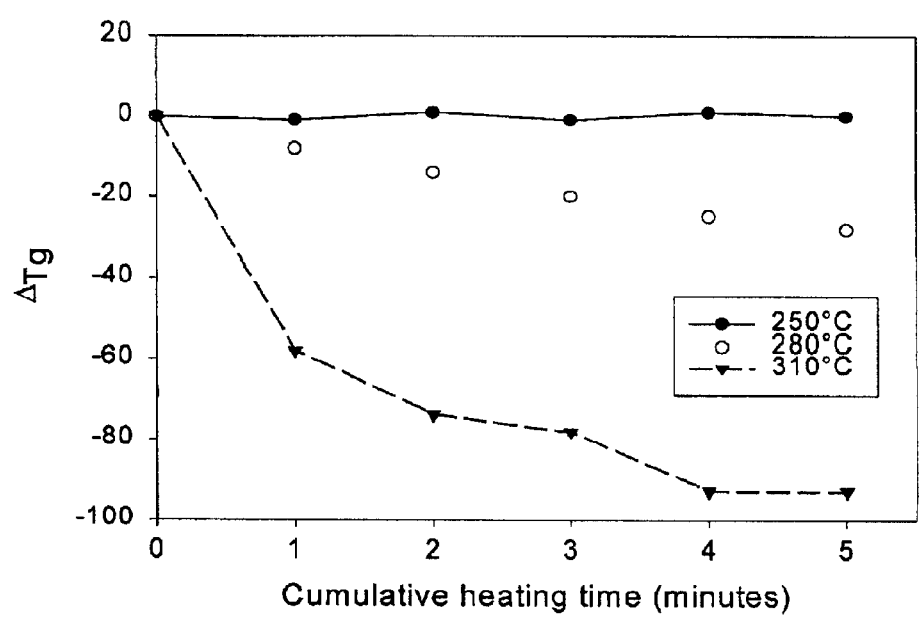
FIG. 11 depicts the thermal degradation an anhydride-cured ERL-4221 formulation as a function of heating time at various temperatures. Initial Tg=196° C.

S. Yang et al., *Chem. Mater.*, 10(6), 1475 (1998) report that an epoxy composition containing ERL-4221 and HHMPA has stable mechanical properties above its glass transition temperature. As such, reaction products of this composition would be unsuitable for use in reworkable epoxy-based formulations. Sample No. 5 was cured and subjected to DSC analysis as described in Example 7. The results, presented in FIG. 11, show that the reaction product exhibited no decomposition at a temperature of 250° C. and only a small decomposition at a temperature of 280° C. Temperatures well in excess of 300° C. were needed before a sufficient reduction in Tg was observed to permit reworking of an adhesive that is based on ERL-4221, as its exclusive epoxy monomer. Such temperatures are believed unsuitable for applications where controlled degradability is important to allow for the removal of heat parts without compromising their integrity.

Example 12

Thermal Decomposition Analysis of 4,4'-biphenol-VEGE Adduct Cured with Anhydride A heat curable epoxy composition was prepared by blending together a diepoxy diacetal, 4,4'-biphenol-VEGE adduct synthesized as described in Example 2, and a curative combination of HHMPA, DBA and EG, according to the formulation in Table 6.

TABLE 6

4,4'-biphenol-VEGE formulation (Sample No. 6)
Anhydride/epoxy equivalent weight ratio = 0.78

| Component | Molecular Weight | Weight % | Mole Fraction |
|---|---|---|---|
| 4,4'-biphenol-VEGE | 474 | 63.2 | 0.37 |
| HHMPA | 168 | 35.4 | 0.58 |
| EG | 62 | 0.8 | 0.04 |
| DBA | 135 | 0.6 | 0.01 |

Sample No. 6 was cured and subjected to DSC analysis as described in Example 7. The results are presented in FIG. 6.

Figure 6:
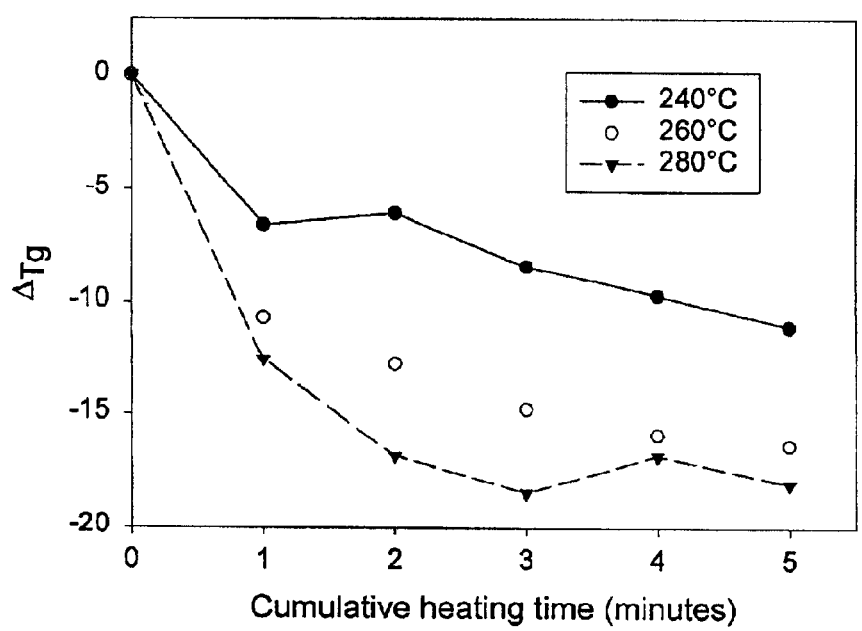
FIG. 6 depicts the thermal degradation of an anhydride-cured 4,4'-biphenol-VEGE formulation as a function of heating time at various temperatures. Initial Tg=50° C.

The data in FIG. 6 shows that rapid and sustained network decomposition occurs in the temperature range of 240–260° C., indicating that 4,4'-biphenol-V2GE adduct is suitable in the formulation of reworkable underfill sealants, which are intended to be controllably degraded within that temperature range.

Example 13

Thermal Decomposition Analysis of THPM-VEGE Adduct Cured with Anhydride

A heat curable epoxy composition was prepared from the epoxy monomer, THPM-VEGE adduct, synthesized as described in Example 3, and a curative combination of HHMPA, DBA and EG, according to the formulation in Table 7. The formulation details are shown in Table 7.

TABLE 7

THPM-VEGE formulation (Sample No. 7)
Anhydride/epoxy equivalent weight ratio = 0.88

| Component | Molecular Weight | Weight % | Mole Fraction |
|---|---|---|---|
| THPM-VEGE | 724 | 60.6 | 0.26 |
| HHMPA | 168 | 38.0 | 0.69 |
| EG | 62 | 0.8 | 0.04 |
| DBA | 135 | 0.6 | 0.01 |

Sample No. 7 was cured and subjected to DSC analysis as described in Example 7. The results are presented in FIG. 4.

Figure 4:
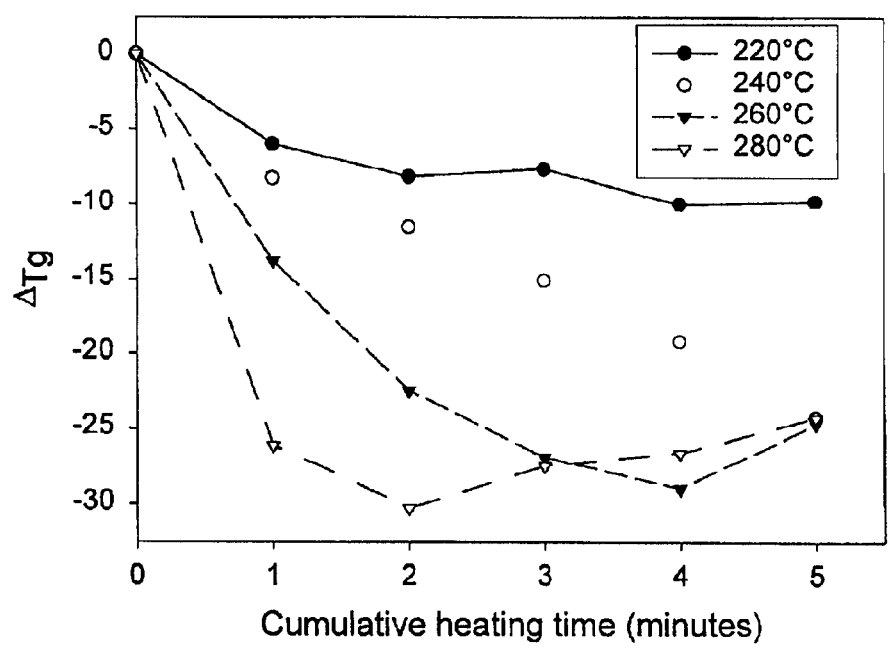
FIG. 4 depicts the thermal degradation of an anhydride-cured THPM-VEGE formulation as a function of heating time at various temperatures. Initial Tg=78° C.

The data in FIG. 4 shows that rapid and sustained network breakdown occurs at temperatures in the range of 240 to 260° C. and indicates THPM-VEGE is suitable for the formulation of underfill sealants, whose reaction products have a decomposition profile within that temperature range.

Example 14

In this example, thermosetting resin compositions were prepared based on BPA-VEGE by mixing together for a period of time of about 10 minutes at room temperature in an open vessel the following components:

TABLE 8

| Component | | Sample No./Amount (weight percent) | | | | | | | | | |
|---|---|---|---|---|---|---|---|---|---|---|---|
| Type | Identity | 8 | 9 | 10 | 11 | 12 | 13 | 14 | 15 | 16 | 17 |
| Epoxy Resin | BPA-VEGE | 26.11 | 26.01 | 26.22 | 26.12 | 29.38 | 32.64 | 35.90 | 39.17 | 42.37 | 39.11 |
| | Limonene Diepoxide | — | — | — | — | — | — | — | — | — | 3.26 |
| | RE-404-S | 39.17 | 39.02 | 39.34 | 39.18 | 35.90 | 32.64 | 26.38 | 26.11 | 22.81 | 22.81 |
| Inorganic Filler | SO-ES (Silica) | 30 | 30 | 30 | 30 | 30 | 30 | 30 | 30 | 30 | 30 |
| Curing Agent | NXJ-60 (Imidazole) | 1.4 | 1.39 | 3.93 | 3.92 | 1.4 | 1.4 | 1.4 | 1.4 | 1.4 | 1.4 |
| | CG-1400 (Dicyandiamide) | 3.14 | 3.13 | 0.33 | 0.33 | 3.14 | 3.14 | 3.14 | 3.14 | 3.14 | 3.14 |
| Flowability Agent | A-137 (Octyl Silane) | 0.06 | 0.15 | 0.06 | 0.15 | 0.06 | 0.06 | 0.06 | 0.06 | 0.06 | 0.06 |
| | A-187 (Glycidyl Silane) | 0.06 | 0.15 | 0.06 | 0.15 | 0.06 | 0.06 | 0.06 | 0.06 | 0.06 | 0.06 |
| | KR-55 (Titanate) | 0.06 | 0.15 | 0.06 | 0.15 | 0.06 | 0.06 | 0.06 | 0.06 | 0.06 | 0.06 |
| Pigment | Black | — | — | — | — | — | — | — | — | — | 0.1 |

Example 15
Influence of Residual Catalyst on Storage Stability and Reactivity of BPA-VEGE Formulations In the synthesis of epoxidized aromatic acetals by reaction of multi-functional phenols, such as bisphenol A, with vinyloxyglycidyl ethers, such as VEGE, the inclusion of an acid catalyst achieves rapid reaction rates and enables good conversion to the desired epoxy-acetal monomers. In FIG. 14, the conversion of bisphenol A by reaction with VEGE is shown as a function of reaction time for catalysts OPA and trifluoroacetic acid ("TFA"). The percent conversion was estimated by following the disappearance of the phenolic group absorbance in the IR spectrum of the reaction mixture according to the expression $100(1-R_t/R_0)$, where $R_0$ is the peak absorbance ratio 3400/2900 cm$^{-1}$ of the initial reaction mixture (i.e., at t=0) and $R_t$ is corresponding absorbance ratio after time t.

Figure 13:
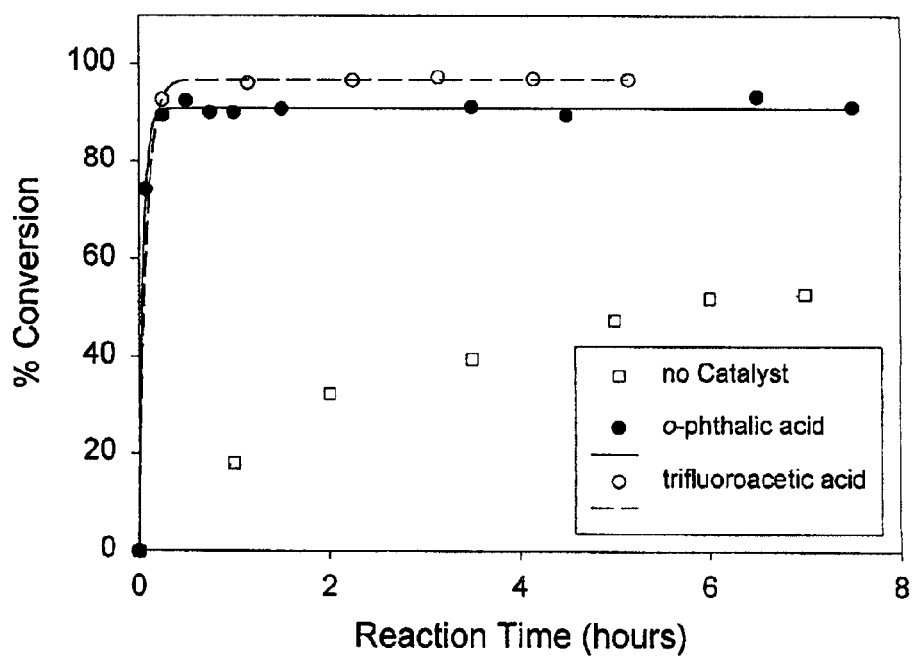
FIG. 13 depicts a time/conversion plot for catalyzed and uncatalyzed reactions of BPA and VEGE.

FIG. 13 shows that the relatively strong acid, TFA (pKa=0.3) and the relatively weak acid, OPA (pKa=2.9) are both effective catalysts in promoting the reaction of phenols with vinyloxyglycidyl ethers under the reaction conditions set forth above. In these cases, the reactions are essentially complete within the first 30 minutes of reaction time. The small differences observed in extent of reaction observed between OPA and TFA are within the experimental error of the quantitative IR analytical method and are not significant. In contrast, the reaction without added catalyst is slow and conversion is incomplete even after several hours of reaction time.

In order to examine the effect of residual acid catalysts on the long-term stability and reactivity of epoxidized aromatic acetal monomers, samples of BPA-VEGE, prepared using TFA and OPA catalysts, were heat aged for 90 days at 80° C. The prolonged heating of the monomers in this manner is expected to accelerate acid catalyzed reactions that might occur in the absence of curing agents. After heat-aging, formulations containing BPA-VEGE, DBA, and EG, were prepared. Similar compositions were prepared from BPA-VEGE monomers that were not heat-aged. The formulation used to prepare the various adhesive samples is shown in Table 9.

TABLE 9

Formulation of BPA-VEGE adhesives (monomer prepared with different acid catalysts). Anhydride/epoxy equivalent weight ratio = 0.90

| Component | Molecular Weight | Weight % | Mole Fraction |
|---|---|---|---|
| BPA-VEGE | 516 | 61 | 0.32 |
| HHMPA | 168 | 36 | 0.58 |
| EG | 62 | 2 | 0.08 |
| DBA | 135 | 1 | 0.02 |

The curing reactivity of each formulation was determined by DSC analysis. The results are presented in Table 10.

TABLE 10

Results of DSC analysis (heating rate = 20° C./min) of formulations containing unaged and heat-aged (90 days at 80° C.) BPA-VEGE monomers

| Residual catalyst | Heat-aged monomer | $T_{ONSET}$ (° C.) | $T_{PEAK}$ (° C.) | Enthalpy (J/g) |
|---|---|---|---|---|
| OPA | no | 124 | 165 | 171 |
| OPA | yes | 122 | 165 | 172 |
| TFA | no | 124 | 165 | 171 |
| TFA | yes | 125 | 172 | 53 |

The data show that there is no change in the curing performance of the adhesive formulations containing residual OPA catalyst. The peak temperature ("$T_{PEAK}$") and onset temperature ("$T_{ONSET}$") may be determined from the DSC measurement, and remain essentially unchanged following the heat aging of the epoxy monomer. This indicates that residual OTA catalyst does not adversely affect the stability or reactivity of the BPA-VEGE monomer on prolonged storage. In contrast, the enthalpy of the adhesive sample prepared with the heat-aged monomer containing residual TFA catalyst shows significant reduction in curing enthalpy compared to the formulation containing the corresponding unaged monomer. At an enthalpy of 53 J/g, this material has only about 30% of its original reactivity. This result indicates that residual TFA tends to reduce epoxide reactivity on prolonged storage.

Shelf-Stability

While the compositions were used upon formation (see below), they may be stored for a period of time of up to about 3 to about 6 months at a temperature of about −40° C. without experiencing viscosity increase.

After formation, the compositions were transferred to a 10 ml syringe made of non-reactive plastic.

Mounting/Underfill Process

Using cream solder (such as Loctite 3834, manufactured by Loctite Corporation), a CSP having a package of 20 mm square, an electrode diameter of 0.5 mm, an electrode pitch of 1.0 mm, and a carrier substrate made of alumina was mounted on a 1.6 mm thick glass-reinforced epoxy board having a circuit formed thereon.

Sample Nos. 8–17 were dispensed through a 12G needle connected to the syringe into the junction between the carrier substrate and semiconductor device an assembly previously formed as above.

After such dispensing, the assembly was transferred to an oven while the temperature was maintained at about 165° C. The composition cured initially after about 1 minute, and thereafter cured completely after about 15 minutes at that temperature.

Certain of the samples were dispensed onto an aluminum dish, and cured in a step-wise manner by exposure to an elevated temperature of about 100° C. for a period of time of about 2 hours, followed by exposure to an elevated temperature of about 140° C. for a period of time of about 6 hours, at the end of which time the compositions were observed to have cured.

Physical Properties

The compositions have a variety of properties in both the uncured and cured state which are measurable and useful parameters for the end user in choosing a particular formulation for a desired need.

For instance, in the uncured state, the flow rate is of interest; in reaching the cured state, the cure schedule is of interest.

The flow time allows the end user to determine the rapidity with which the adhesive may be applied during a fabrication process, such as a circuit assembly operation. It may be measured by passing the composition through a 25 μm gap between glass slides aligned perpendicular to one another, using metal shims as spacers. The time required for the composition to flow between the slides is then measured at a length of about one inch, at 0.25 inch intervals. Values in seconds for the flow times of the compositions set forth above are presented as an average of three measurements below in Table 11.

The cure schedule refers to the time required for the onset of cure to occur at a certain temperature, in a specified period of time. This may be seen in more detail with regard to certain of the samples prepared in accordance with the present invention below in Table 11.

TABLE 11

| | Physical Properties | |
|---|---|---|
| Sample No. | Flow Time (secs, .5" @100° C.) | Cure Schedule (mins@165° C.) |
| 8 | 31 | 10–15 |
| 9 | 31 | 10–15 |
| 10 | 28 | 10–15 |
| 11 | 22 | 10–15 |

As the composition progresses through its cure schedule, the reaction exotherm, or enthalpy, assists in determining the effectiveness of a (co)polymerization reaction. The reaction exotherm here is measured by DSC.

The $T^{PEAK}$ and $T_{ONSET}$ values provide information for minimum reasonable curing temperatures, the curing temperature range, maximum reaction temperatures, and relative curing time at each temperature. See Table 12 for these values of certain samples.

TABLE 12

| | Physical Properties | | |
|---|---|---|---|
| Sample No. | Enthalpy (J/g) | $T_{PEAK}$ (° C.) | $T_{ONSET}$ (° C.) |
| 8 | 283 | 132 | 132 |
| 9 | 296 | 133 | 133 |
| 10 | 278 | 129 | 129 |
| 11 | 258 | 128 | 128 |
| 16 | 274 | 144 | 126 |
| 17 | 275 | 143 | 126 |

In the cured state, a variety of properties are useful depending on the end use for which the composition is destined.

For instance, adhesion provides information on the strength of the bond formed by the cured reaction product, data for which is set forth in Table 13. In this adhesion evaluation, die shear adhesion is measured by a DAGE die shear measurement instrument, which measures the amount of shear strength (in Kgf) required to pull apart a die attached to a circuit board by the cured reaction product as an underfill sealant (without a solder mask, or chipbonding adhesive).

TABLE 13

| | Adhesion (Die Shear, Kgf) | |
|---|---|---|
| Sample No. | Initial | 24 hrs in boiling water |
| 8 | 69 | 23 |
| 9 | 72 | 31 |
| 10 | 62 | 33 |
| 11 | 69 | 25 |
| 12 | 75 | — |
| 13 | 66 | — |
| 14 | 65 | — |
| 15 | 59 | — |
| 16 | 58 | — |
| 17 | 63 | — |

Many additional embodiments thereof are included in the spirit and scope of the invention, which are defined by the claims.

What is claimed is:

1. A thermosetting resin composition, reaction products of which are capable of softening and losing their adhesiveness under exposure to temperature conditions in excess of those used to cure the composition, said composition comprising:
   (a) a curable resin component, at least a portion of which comprises an aromatic compound having at least two thermally cleavable acetal or thioacetal linkages and at least two reactive groups selected from the group consisting of epoxy groups, episulfide groups, and combinations thereof; and
   (b) a curing agent component selected from the group consisting of anhydrides, nitrogen-containing compounds, polythiols, polyphenols, polycarboxylic acids, onium salts, and combinations thereof.

2. The composition according to claim 1, wherein the aromatic compound is an epoxy compound having at least two thermally cleavable acetal linkage is a member selected from the group consisting of: BPA-VEGE, BPF-VEGE, BPA-VBGE, BPF-VBGE, THPM-VEGE, THPM-VBGE, HQ-VEGE, HQ-VBGE, BPA-GOVAC, BPF-GOVAC, THPM-GOVAC, HQ-GOVAC, and combinations thereof.

3. The composition according to claim 1, wherein the nitrogen-containing compound is a member selected from the group consisting of amine compounds, amide compounds, imidazole compounds, and combinations thereof.

4. The composition according to claim 3, wherein the amine compounds of the curing agent component may be selected from the group consisting of dicyandiamide, diethylenetriamine, triethylenetetramine, diethylaminopropylamine, m-xylenediamine, diaminodiphenylamine, isophoronediamine, menthenediamine, polyamides, and combinations thereof.

5. The composition according to claim 3, wherein the amide compound is dicyandiamide.

6. The composition according to claim 3, wherein the imidazole compounds of the curing agent component may be selected from the group consisting of imidazole, isoimidazole, 2-methyl imidazole, 2-ethyl-4-methylimidazole, 2,4-dimethylimidazole, butylimidazole, 2-heptadecenyl-4-methylimidazole, 2-undecenylimidazole, 1-vinyl-2-methylimidazole, 2-n-heptadecylimidazole, 2-undecylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, addition products of an imidazole and trimellitic acid, addition products of an imidazole and 2-n-heptadecyl-4-methylimidazole, phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, 2-phenyl-4,5-dihydroxymethyl imidazole, and combinations thereof.

7. The composition according to claim 1, further comprising an inorganic filler component.

8. The composition according to claim 7, wherein the inorganic filler component is a member selected from the group consisting of materials constructed of or containing reinforcing silicas, aluminum oxide, silicon nitride, aluminum nitride, silica-coated aluminum nitride, boron nitride, and combinations thereof.

9. The composition according to claim 7, wherein the curable resin component is present in an amount within the range of about 10 to about 70 weight percent, based on the total weight of the composition, of which about 10 to about 75 weight percent thereof is comprised of a curable aromatic compound having at least two thermally cleavable acetal linkages and at least two epoxy groups; the curing agent component is present in an amount within the range of 3 to about 100 weight percent, based on the total weight of the epoxy resin component; the inorganic filler component is present in an amount up to about 70 weight percent, based on the total weight of the composition; and further comprising (d) a flowability agent, present in an amount up to about 0.5 weight percent, based on the total weight of the composition.

10. The composition according to claim 1, further comprising a flowability agent.

11. The composition according to claim 10, wherein the flowability agent is a member selected from the group consisting of silanes, titanates and combinations thereof.

12. The composition according to claim 10, wherein the flowability agent is selected from octyl trimethoxy silane, methacryloxy propyl trimethoxy silane, titanium IV tetrakis [2,2-bis[(2-propenyloxy)methyl]-1-butanolato-1] [bis (ditridecylphosphito-0), dihydrogen]$_2$, and combinations thereof.

13. The composition according to claim 1, further comprising an adhesion promoter.

14. The composition according to claim 13, wherein the adhesion promoter is a member selected from the group consisting of glycidyl trimethoxysilane, gamma-amino propyl triethoxysilane, and combinations thereof.

15. The composition according to claim 1, further comprising a cyanate ester.

16. The composition according to claim 15, wherein the cyanate ester is a member selected from the group consisting of dicyanatobenzenes, tricyanatobenzenes, dicyanatonaphthalenes, tricyanatonaphthalenes, dicyanatobiphenyl, bis(cyanatophenyl)methanes and alkyl derivatives thereof, bis(dihalocyanatophenyl)propanes, bis (cyanatophenyl)ethers, bis(cyanatophenyl)sulfides, bis (cyanatophenyl)propanes, tris(cyanatophenyl)phosphites, tris(cyanatophenyl)phosphates, bis(halocyanatophenyl) methanes, cyanated novolac, bis[cyanatophenyl (methylethylidene)]benzene, cyanated bisphenol-terminated thermoplastic oligomers, and combinations thereof.

17. The composition according to claim 1, wherein the anhydride compounds of the curing agent component may be selected from the group consisting of hexahydrophthalic anhydride, methyl hexahydrophthalic anhydride, 5-(2,5-dioxotetrahydrol)-3-methyl-3-cyclohexene-1,2-dicarboxylic anhydride, and combinations thereof.

18. Reaction products formed from the compositions according to claim 1.

19. An electronic device comprising a semiconductor device and a circuit board to which said semiconductor device is electrically connected or a semiconductor chip and a circuit board to which said semiconductor chip is electrically connected, assembled using a thermosetting resin composition according to claim 1 as an underfill sealant between the semiconductor device and the circuit board or the semiconductor chip and the circuit board, respectively, wherein reaction products of the composition are capable of softening and losing their adhesiveness under exposure to temperature conditions in excess of those used to cure the composition.

20. A method of sealing underfilling between a semiconductor device including a semiconductor chip mounted on a carrier substrate and a circuit board to which said semiconductor device is electrically connected or a semiconductor chip and a circuit board to which said semiconductor chip is electrically connected, the steps of which comprise:

(a) dispensing into the underfilling between the semiconductor device and the circuit board or the semiconductor chip and the circuit board a composition in accordance with claim 1; and (b) exposing the composition as so dispensed to conditions appropriate to cause the composition to form a reaction product.

21. A method of reworking a reaction product of a composition in accordance with claim 1, a step of which comprises;
(a) exposing the reaction product to conditions appropriate to cause the reaction product to soften and lose adhesiveness.

22. The method according to claim 21, wherein the reaction product seals the underfilling between a semiconductor device including a semiconductor chip mounted on a carrier substrate and a circuit board to which said semiconductor device is electrically connected or a semiconductor chip and a circuit board to which said semiconductor chip is electrically connected further comprising the steps of:
(a) removing the semiconductor chip or semiconductor device from the circuit board; and
(b) optionally, cleaning the surface of the circuit board to remove any cured reaction product that remains.

23. A thermosetting resin composition, reaction products of which are capable of softening and losing their adhesiveness under exposure to temperature conditions in excess of those used to cure the composition, said composition comprising:
(a) a curable resin component, at least a portion of which comprises the combination of
(i) a first reworkable curable resin selected from the group consisting of limonene diepoxide, gamma-terpinene diepoxide, methyl cyclopentadiene diepoxide dimer, ethylidene norbornene diepoxide, nopol epoxide glycidyl ether, and combinations thereof; and
(ii) a second reworkable curable resin selected from the group consisting of an aromatic compound having at least two thermally cleavable [aromatic] acetal or thioacetal linkages and at least two reactive groups selected from the group consisting of epoxy groups, episulfide groups, and combinations thereof; and
(b) a curing agent component selected from the group consisting of anhydrides, nitrogen-containing compounds, polythiols, polyphenols, polycarboxylic acids, onium salts, and combinations thereof.

24. A curable aromatic compound having at least two thermally cleavable linkages, and at least two reactive groups selected from the group consisting of epoxy groups, episulfide groups, and combinations thereof, wherein the curable aromatic compound is a member selected from the group consisting of:

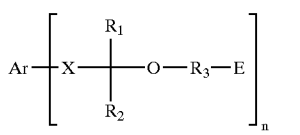
I

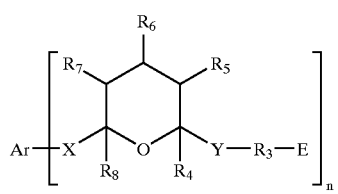
II wherein:
X is an oxygen atom or a sulfur atom;
Ar represents a single aromatic ring nucleus or multiple aromatic ring nuclei, which may be fused or linked through direct covalent bonds, oxygen atoms, sulfur atoms, ketone groups, sulfoxide groups, sulfone groups, $C_{1-6}$ alkylene or $C_{2-6}$ alkenylene groups optionally substituted with trifluoromethyl groups, or poly ($C_{2-4}$ oxyalkylene) and the aromatic ring(s) may be further optionally substituted with $C_{1-6}$ alkyl, $C_{3-8}$ cyloalkyl, $C_{2-6}$ alkenyl, alkoxy groups, acetyl groups, or methylol groups;

n represents an integer between 2 and 6 when Ar is a single aromatic ring nucleus and an integer between 2 and 8 when Ar is a multiple aromatic ring nuclei;

Y is an oxygen atom, an alkylene group or a carbonyl group;

$R_1$ is hydrogen or alkyl;

$R_2$ is $C_{1-8}$ alkyl, $C_{2-9}$ alkenyl or $C_{6-11}$ aryl group;

$R_3$ is $C_{1-15}$ alkylene, $C_{3-15}$ cycloalkylene, $C_{7-15}$ bicycloalkylene, $C_{2-15}$ alkenylene, $C_{5-15}$ cycloalkenylene, $C_{7-30}$ bicycloalkenylene, $C_{1-15}$ alkylene ester, $C_{2-15}$ alkylene ether, $C_{2-30}$ alkenylene ester, $C_{2-15}$ alkenylene ether, phenylene, phenylene ether, or phenylene ester, each of which may be optionally substituted with one or more hydroxyl, alkoxy, or ester or interrupted with one or more ester, ether, or carbamate groups;

$R_4$, $R_5$, $R_6$, $R_7$, $R_8$ are independently H, $C_{1-12}$ alkyl, alkenyl, cyclo- or bicyclo-alkyl, cyclo- or bicyclo-alkenyl, or aryl; and E represents an aliphatic, cycloaliphatic or bicycloaliphatic epoxide or episulfide group having the structure indicated by E1–E4:

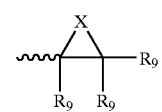
E1

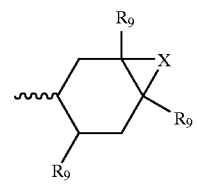
E2

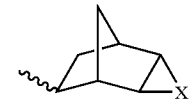
E3

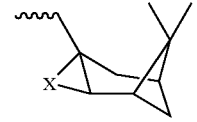
E4 wherein $R_9$ is a H atom or a $C_{1-6}$ alkyl group, X is as defined above and the wavy line indicates the attachment to $R_3$ of structure I and II.

25. The curable aromatic compound according to claim 24, wherein the curable aromatic compound is a member selected from the group consisting of: BPA-VEGE, BPF-VEGE, BPA-VBGE, BPF-VBGE, THPM-VEGE, THPM-VBGE, HQ-VEGE, HQ-VBGE, BPA-GOVAC, BPF-GOVAC, THPM-GOVAC, HQ-GOVAC, and combinations thereof.

26. A method of preparing the curable aromatic compound according to claim 24, comprising the steps of:

(a) providing an aromatic compound having at least two reactive groups selected from hydroxyl groups, thiol groups, and combinations thereof;

(b) providing an epoxidized or episulfidized vinyl ether; and (c) providing a weak organic acid under conditions appropriate to catalyze the reaction between components (a) and (b).

27. A thermosetting resin composition, reaction products of which are capable of softening and losing their adhesiveness under exposure to temperature conditions in excess of those used to cure the composition, said composition comprising:

(a) a curable resin component, at least a portion of which comprises an aromatic compound having at least two thermally cleavable linkage and at least two reactive groups selected from the group consisting of epoxy groups, episulfide groups, and combinations thereof; and (b) a curing agent component selected from the group consisting of anhydrides, nitrogen-containing compounds, polythiols, polyphenols, polycarboxylic acids, onium salts, and combinations thereof, wherein the aromatic compound having at least two thermally cleavable linkages is selected from those within the following structures I and II:

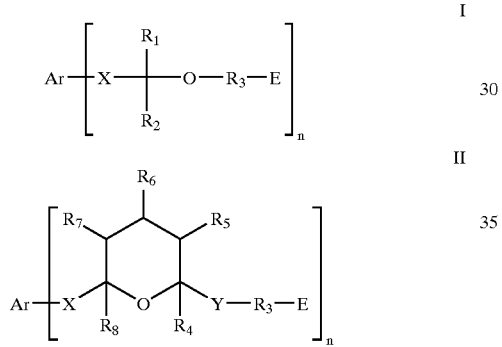

wherein:

X is an oxygen atom or a sulfur atom;

Ar represents a single aromatic ring nucleus or multiple aromatic ring nuclei, which may be fused or linked through direct covalent bonds, oxygen atoms, sulfur atoms, ketone groups, sulfoxide groups, sulfone groups, $C_{1-6}$ alkylene or $C_{2-6}$ alkenylene groups optionally substituted with trifluoromethyl groups, or poly($C_{2-4}$ oxyalkylene), and the aromatic ring(s) may be further optionally substituted with $C_{1-6}$ alkyl, $C_{3-8}$ cyloalkyl, $C_{2-6}$ alkenyl, alkoxy groups, acetyl groups, or methylol groups;

n represents an integer between 2 and 6 when Ar is a single aromatic ring nucleus and an integer between 2 and 8 when Ar is a multiple aromatic ring nuclei;

Y is a member selected from the group consisting of an oxygen atom, an alkylene group, and a carbonyl group;

$R_1$ is a hydrogen atom or an alkyl group;

$R_2$ is a member selected from the group consisting of $C_{1-8}$ alkyl group, $C_{2-8}$ alkenyl groups and $C_{6-11}$ aryl groups;

$R_3$ is $C_{1-15}$ alkylene, $C_{3-15}$ cycloalkylene, $C_{7-15}$ bicycloalkylene, $C_{2-15}$ alkenylene, $C_{5-15}$ cycloalkenylene, $C_{7-30}$ bicycloalkenylene, $C_{1-15}$ alkylene ester, $C_{2-15}$ alkylene ether, $C_{2-30}$ alkenylene ester, $C_{2-15}$ alkenylene ether, phenylene, phenylene ether, or phenylene ester, each of which may be optionally substituted with one or more hydroxyl, alkoxy, or ester, or interrupted with one or more ester, ether, or carbamate groups;

$R_4$, $R_5$, $R_6$, $R_7$, and $R_8$ are independently H, $C_{1-12}$ alkyl, alkenyl, cyclo- or bicyclo-alkyl, cyclo- or bicyclo-alkenyl, or aryl; and E is a member selected from the group consisting of an aliphatic, cycloaliphatic or bicycloaliphatic epoxide or episulfide group having a structure indicated by E1–E4:

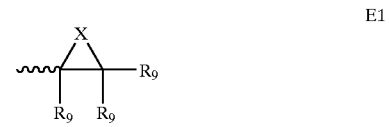

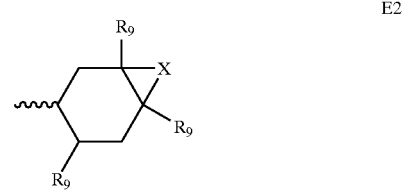

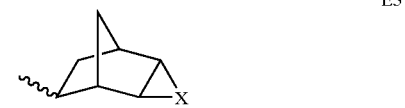

wherein $R_9$ is a hydrogen atom or an alkyl group, X is as defined above and the wavy line indicates the attachment to $R_3$ of structure I and II.

* * * * *

UNITED STATES PATENT AND TRADEMARK OFFICE
CERTIFICATE OF CORRECTION

PATENT NO. : 6,887,737 B1
APPLICATION NO. : 10/013487
DATED : May 3, 2005
INVENTOR(S) : Woods et al.

Page 1 of 1

It is certified that error appears in the above-identified patent and that said Letters Patent is hereby corrected as shown below:

Column 10, line 30, delete "here" and insert therefor --where--.

Column 26, line 20, delete "4,4'-biphenol-V2GE" and insert therefor --4,4'-biphenoI-VEGE--.

Column 30, line 3, delete "$T^{PEAK}$" and insert therefor --$T_{PEAK}$--.

Signed and Sealed this

Thirtieth Day of June, 2009

JOHN DOLL
*Acting Director of the United States Patent and Trademark Office*